(12) United States Patent
Anthony Sazio et al.

(10) Patent No.: US 7,799,663 B2
(45) Date of Patent: Sep. 21, 2010

(54) FABRICATION OF SEMICONDUCTOR METAMATERIALS

(75) Inventors: Pier John Anthony Sazio, Southhampton (GB); John Victor Badding, Southhampton (GB); Dan William Hewak, Southhampton (GB)

(73) Assignee: University of Southampton, Hampshire (GB)

( * ) Notice: Subject to any disclaimer, the term of this patent is extended or adjusted under 35 U.S.C. 154(b) by 790 days.

(21) Appl. No.: 10/595,321

(22) PCT Filed: Oct. 8, 2004

(86) PCT No.: PCT/GB2004/004257

§ 371 (c)(1),
(2), (4) Date: May 23, 2007

(87) PCT Pub. No.: WO2005/036224

PCT Pub. Date: Apr. 21, 2005

(65) Prior Publication Data

US 2008/0138571 A1    Jun. 12, 2008

(30) Foreign Application Priority Data

Oct. 10, 2003    (GB) ................................. 0323806.0

(51) Int. Cl.
*H01L 21/36* (2006.01)
*H01L 21/00* (2006.01)

(52) U.S. Cl. ...................................... 438/478; 438/800
(58) Field of Classification Search ....................... None
See application file for complete search history.

(56) References Cited

U.S. PATENT DOCUMENTS

| | | |
|---|---|---|
| 5,838,868 A | 11/1998 | Krol et al. |
| 6,001,419 A | 12/1999 | Leluan |
| 6,496,634 B1 | 12/2002 | Levenson |
| 6,576,345 B1 | 6/2003 | Van Cleemput et al. |
| 2002/0137260 A1 | 9/2002 | Leung et al. |
| 2003/0035631 A1 | 2/2003 | Eggleton et al. |
| 2003/0123827 A1* | 7/2003 | Salerno et al. .............. 385/129 |
| 2007/0273055 A1* | 11/2007 | Sazio et al. ................ 264/1.24 |

FOREIGN PATENT DOCUMENTS

DE    19701723    1/2002

(Continued)

OTHER PUBLICATIONS

U.S. Appl. No. 10/595,323, filed Mar. 22, 2007, Sazio et al.*

(Continued)

*Primary Examiner*—Scott B Geyer
(74) *Attorney, Agent, or Firm*—Renner, Otto, Boisselle & Sklar, LLP

(57) ABSTRACT

A method of fabricating a semiconductor metamaterial is provided, comprising providing a sample of engineered microstructured material that is transparent to electromagnetic radiation and comprises one or more elongate, high aspect ratio voids, passing through the voids a high pressure fluid comprising a semiconductor material carried in a carrier fluid, and causing the semiconductor material to deposit onto the surface of the one or more voids of the engineered microstructured material to form the metamaterial. Many microstructured materials and semiconductor materials can be used, together with various techniques for controlling the location, spatial extent, and thickness of the deposition of the semiconductor within the microstructured material, so that a wide range of different metamaterials can be produced.

39 Claims, 27 Drawing Sheets

FOREIGN PATENT DOCUMENTS

| | | |
|---|---|---|
| EP | 1345069 | 9/2003 |
| WO | 03/058307 | 7/2003 |
| WO | 03/060442 | 7/2003 |
| WO | 03/080524 | 10/2003 |
| WO | 01/32952 | 4/2006 |

OTHER PUBLICATIONS

Pavesi, L. et al., "Optical Gain in Silicon Nanocrystals." Nature. 408.6811 (Nov. 23, 2000): 440-444.

Pavesi, L. et al. "Will Silicon be the Photonic Material of the Third Millenium?" Journal of Physics: Condensed Matter. 15.26 (Jun. 20, 2003): R1169-R1196.

Butty, J. et al. "Quasicontinuous gain in sol-gel derived CdS quantum dots." Applied Physics Letters. 67.18 (Oct. 30, 1995): 2672-2674.

Wundke, K. et al. "Room-temperature gain at 1.3 μm in PbS-doped glasses." Applied Physics Letters. 75.20 (Nov. 15, 1999): 3060-3062.

Miyagi, Mitsunobo et al. "Fabrication of germanium-coated nickel hollow waveguides for infrared transmission." Applied Physics Letters. 43.5 (Sep. 1, 1983): 430-432.

Harrington, James A. et al. "A Review of IR Transmitting, Hollow Waveguides." Fiber and Integrated Optics. 19 (2000): 211-227.

Holmes, Justin D. et al. "Control of Thickness and Orientation of Solution-Grown Silicon Nanowires." Science. 287 (Feb. 25, 2000): 1471-1473.

Coleman, Nicholas R.B. et al. "The formation of dimensionally ordered silicon nanowires within mesoporous silica." Journal of the American Chemical Society. 123 (2001): 187-188.

Lew, Kok-Keong et al. "Template-directed vapor-liquid-solid growth of silicon nanowires." Journal of Vacuum Science Technology. B20.1 (2002): 389-392.

Larsen, Thomas Tanggaard et al. "Optical devices based on liquid crystal photonic bandgap fibres." Optics Express. 11.20 (Oct. 2003): 2589-2596.

Cooper, Andrew I. "Porous materials and Supercritical Fluids." Advanced Materials. 15.13 (Jul. 4, 2003): 1049-1059.

Eggleton, B.J. et al. "Microstructured optical fiber devices." Optics Express. 9.13 (Dec. 5, 2001): 698-713.

Watson, Michael S. et al. "Incorporation of Proteins into Polymer Materials by a Novel Supercritical Fluid Processing Method." Advanced Material. 14.24 (Dec. 17, 2002): 1802-1804.

Key, M. et al. "Propagation of Cold Atoms along a Miniature Magnetic Guide." Physical Review Letters. 84.7, (Feb. 14, 2000): 1371-1373.

Kazansky, P.G. et al. "Electrically Stimulated Light-Induced Second-Harmonic Generation in Glass: Evidence of Coherent Photoconductivity." Physical Review Letters. 78.15 (Apr. 14, 1997): 2956-2959.

Norris, David J. et al. "Chemical Approaches to Three-Dimensional Semiconductor Photonic Crystals." Advanced Materials. 13.6 (Mar. 16, 2001): 371-376.

Vlasov, Yu. A. et al. "Enhancement of optical gain of semiconductors embedded in three-dimensional photonic crystals." Applied Physics Letters. 71.12 (Sep. 22, 1997): 1616-1618.

Kazes, Miri et al. "lasing from semiconductor quantum rods in a cylindrical microcavity." Advanced Materials. 14.4 (Feb. 19, 2002): 317-321.

Fokine, M. et al. "Integrated fiber Mach-Zehnder interferometer for electro-optic switching." Optics Letters. 27.18 (Sep. 15, 2002): 1643-1645.

Kenis, Paul J.A. et al. "Fabrication inside microchannels using fluid flow." Accounts of Chemical Research. 33.12 (2000): 841-847.

* cited by examiner

FABRICATION OF SEMICONDUCTOR METAMATERIALS

This application is a national phase of International Application No. PCT/GB2004/004257 filed Oct. 8, 2004 and published in the English language.

BACKGROUND OF THE INVENTION

The present invention relates to the fabrication of semiconductor metamaterials.

Metamaterials are periodically repeating, synthetic composite structures that are specifically engineered to circumvent inconvenient bulk material properties. The exceptional characteristics and response functions of metamaterials are not observed in the individual constituent materials of the composite, and these phenomena arise as a direct result of the periodic inclusion of functional materials such as metals, semiconductors or polymers embedded within the composite. However, the fabrication of such structures is a serious experimental challenge as this full three-dimensional deposition and patterning requirement is extremely difficult to satisfy using conventional techniques such as chemical vapour deposition and photolithography.

Holey optical fibres exploit the concept of using a periodic array of air holes to define the transverse refractive index profile of the fibre. These fibres have exhibited exceptional optical properties that significantly outperform conventional fibre structures in key areas, and can guide light either by a modified form of total internal reflection or by exploiting photonic bandgap effects. This has generated enormous interest both within the academic and industrial communities due to novel optical properties that include endlessly single-mode guidance, anomalous dispersion, and mode area tailoring over three orders of magnitude that have many potential applications.

The inclusion of semiconductor materials into holey fibres and other engineered microstructured material to provide specifically tailored metamaterials is of significant technological interest as this allows easy integration into existing optoelectronic systems and devices.

Various techniques addressing this objective have been reported, such as the deposition of semiconductor materials onto fibre performs which are then pulled into optical fibres [1]. Direct bandgap bulk CdTe or CdS semiconductors were vacuum deposited onto a Pyrex (RTM) rod which was then inserted into a Pyrex (RTM) tube, thus creating a fibre perform, from which fibres were pulled, for use as light amplifiers for fibre optic communications or as non-linear devices. However, this technique suffers from many disadvantages. Vacuum deposition of semiconductor material onto a low melting temperature glass rod such as Pyrex (RTM) will result in a low quality amorphous layer, which when pulled to fibre will further degrade by reacting with the molten glass and forming a discontinuous film of material at the core-cladding boundary. Pure silica cannot be used in place of Pyrex (RTM) as the melting temperature would quickly vaporize most semiconductors during the pulling process.

Other examples of the incorporation of semiconductor materials into glass includes reports of quasicontinuous spectrally broad optical gain at cryogenic temperatures in CdS quantum dots embedded in borosilicate glass by melting [2], and in PbS quantum dot doped glasses fabricated by thermal treatment of an oxide molten glass which precipitated out the microcrystalline phase [3]. However, these techniques are also limited to use with low melting temperature glasses and suffer from chemical reactivity issues that reduce radiative efficiencies due to surface recombination, the presence of trap states, defects, dangling bonds, photodarkening and low quantum dot densities in the gain medium.

The fabrication of silicon nanocrystal quantum dots in a planar silica substrate has also demonstrated optical gain characteristics, with the use of quantum confined indirect bandgap silicon resulting in a broad ASE spectrum centered around 750 μM [4]. The devices were produced by ion implantation of silicon ions into ultrapure quartz wafers or thermally grown silicon dioxide layers on silicon substrates followed by a high temperature anneal. However, there was low photoluminescence efficiency and incomplete control over the size selection and distribution of the quantum dots, which, together with the planar geometry, mean that these devices may have limited practical use.

Fabrication of infrared waveguides by the impregnation of molten semiconductors into a silica capillary has been proposed, to exploit the high refractive index and ultra wide transmission window of the semiconductor [5]. However, the impregnation method implies using either capillary action or a vacuum process. This has several shortcomings, not least of which is the length over which material can be infused into the capillary, as this process is strongly determined by the properties of viscosity as a function of temperature, surface tension, glass wall adhesion characteristics and thermal expansion coefficients. Also, the choice of semiconductor is severely limited due to the typically high melting points of these materials.

Another example includes the development of germanium-coated nickel hollow waveguides for infrared transmission [6]. The fabrication technique involves placing an aluminum pipe inside a sputtering chamber, onto which is deposited a germanium layer followed by a metallic film. A thick nickel layer is then deposited on top of the sputtered layers in an electroplating tank. The pipe is then etched away leaving a hollow waveguide structure that can exploit Fresnel reflection to guide infrared radiation. A further example of hollow infrared waveguide structures is a process using a polymer-coated silica tubing, inside of which wet chemistry techniques including standard silver plating and iodisation were used to deposit metal and dielectric layers [7]. These two manufacturing methods are quite limited, however, since they result in high-loss waveguides only a few meters in length. The waveguides also suffer from poor reproducibility, additional loss on bending and have very poor mechanical properties, especially compared with conventional telecommunication fibres.

Thus, these various techniques for incorporating semiconductor material into microstructured fibres and other waveguides have many drawbacks, including the inability to fabricate long lengths of material, poor quality semiconductor deposition, and applicability to only a limited range of materials. Given the importance of photonic materials, in particular holey fibres, and their many potential applications, there is, therefore, a need for an improved fabrication technique.

SUMMARY OF THE INVENTION

Accordingly, a first aspect of the present invention is directed to a method of fabricating a metamaterial comprising: providing a sample of elongate engineered microstructured material comprising one or more elongate voids running substantially the length of the sample, the sample configured to transmit electromagnetic radiation; providing a high pressure fluid comprising at least one semiconductor carried in at least one carrier fluid; passing the high pressure fluid through the one or more voids; and causing the semiconductor to deposit onto one or more surfaces of the one or more voids to form the metamaterial.

This is a highly advantageous and beneficial way of combining desirable semiconductor materials with engineered microstructured materials to create metamaterials from which highly specialized devices with novel functionality and which can provide miniaturisation, robustness and other desirable features can be fabricated. That this should be possible using high pressure fluid is surprising, and, results from the fact that high pressure fluids, many of which have low viscosity, high diffusivity and low or zero surface tension, can penetrate into the elongate microstructured voids with great efficiency but at the same time carry the semiconductor and deposit it into the microstructured material in an even and uniform manner. The generally greater extent and particular uniformity of voids in engineered microstructured material (as opposed to self-assembled materials) means that the expected result is that the semiconductor would be unevenly deposited within the voids, not be carried throughout the whole extent of the voids, and be deposited in greater quantities at the void openings so that the voids would become blocked, which is undesirable in that further semiconductor material cannot be carried to the rest of the void, and also in that the voids are often essential for the light transmitting properties of the engineered material and hence need to remain open. However, in practice this has not been observed, and instead it has been found that semiconductor can be deposited with great accuracy and controllability, leading to high quality metamaterials.

The invention therefore allows the many advantages of high pressure fluids to be brought to the field of optical device fabrication. The properties of high pressure fluids makes them preferable for many deposition applications compared to known techniques such as chemical vapour deposition, which is limited to depositing volatile materials and requires highly specialized apparatus. Extremely small scale voids (at least down to nanometer scale) can be worked upon, since high pressure fluid can have very low viscosity and also zero surface tension, so can flow through the tiniest apertures. Also, microstructured materials such as holey fibre are ideally suited for work with such high pressure fluid, since the high tensile strength of the materials combined with the minute volumes of the voids make each void into an almost ideal high pressure microfluidic vessel in which extremely high pressures can be both tolerated and achieved while lying well within defined safety limits, since the potential energy stored is negligible thanks to the small volume. This ability to push the pressure very high while remaining safe can be achieved at low cost, and also enhances the efficiency of the integration process, since the rate of flow of the high pressure fluid can be high, to deliver a substantial amount of semiconductor in a short time.

In a preferred embodiment, the carrier fluid is in its supercritical phase. A supercritical fluid, that is, one that is above its critical temperature and critical pressure, is an ideal high pressure fluid for implementing the present invention, since its excellent properties include low viscosity, high diffusivity and zero surface tension so that a semiconductor can be delivered quickly and evenly. However, many fluids below their critical point, especially close to it, and particularly as regards pressure, also demonstrate the desired characteristics, so that the invention extends below the supercritical phase. This is particularly useful if a carrier fluid has a very high critical pressure or temperature, since it is not essential to achieve these conditions to apply the method. Also, the ability to operate at high pressures below the critical pressure is also advantageous as regards cost and safety. Therefore, in alternative embodiments, the high pressure fluid has a pressure of 1 MPa or above, or of 2.5 MPa or above, or of 5 MPa or above, or of 10 MPa or above, or of 25 MPa or above, or of 50 MPa or above, or of 100 MPa or above, or of 500 MPa or above, or of 1000 MPa or above, or of 2000 MPa or above.

The void penetrating ability of the high pressure fluid allows the invention to be applied to a wide range of microstructured materials having many different void sizes. Semiconductor material can be successfully delivered to very narrow voids, and also over long distances if required, so that the elongate voids may have very high aspect ratios. Thus, according to various embodiments, the one or more voids have a length and a width such that the ratio of the length to the width is in the range 100:1 to 1000:1, or 100:1 to 10000:1, or 100:1 to 100000:1, or 100:1 to $10^6$:1, or 100:1 to $10^7$:1, or 100:1 to $10^8$:1, or 100:1 to $10^9$:1, or 100:1 to $10^{10}$:1, or 100:1 to $10^{11}$:1, or 100:1 to $10^{12}$:1, or 1000:1 to 10000:1, or 1000:1 to 100000:1, or 1000:1 to $10^6$:1, or 1000:1 to $10^7$:1, or 1000:1 to $10^8$:1, or 1000:1 to $10^9$:1, or 1000:1 to $10^{10}$:1, or 1000:1 to $10^{11}$:1, or 1000:1 to $10^{12}$:1 or 10000:1 to 100000:1, or 10000:1 to $10^6$:1, or 10000:1 to $10^7$:1, or 10000:1 to $10^8$:1, or 10000:1 to $10^9$:1, or 10000:1 to $10^{10}$:1, or 10000:1 to $10^{11}$:1, or 10000:1 to $10^{12}$:1, or 100000:1 to $10^6$:1, or 100000:1 to $10^7$:1, or 100000:1 to $10^8$:1, or 100000:1 to $10^9$:1, or 100000:1 to $10^{10}$:1, or 100000:1 to $10^{11}$:1, or 100000:1 to $10^{12}$:1

In particular, nanoscale voids can be used, which are of particular relevance for quantum confinement and the fabrication of mesomaterials. Thus, the one or more voids may have a width in the range 1 nm to 100 nm.

In addition to the wide range of void dimensions that can be accommodated and which have not previously been readily accessible for incorporating semiconductor materials, the method is widely applicable to different types of engineered microstructured materials in general. For example, the sample of microstructured material may comprise a holey optical fibre. Alternatively, the sample of microstructured material may be planar. In any case, the one or more voids may have a smallest dimension between 1 nm and 1 μm. Voids on this scale are relevant in particular for the fabrication of mesomaterials, since quantum confinement can occur for suitable combinations of materials and structure sizes. Thus, in some embodiments, the engineered microstructured material, the at least one semiconductor and dimensions of the one or more voids are selected to give a metamaterial that is a mesomaterial. Alternatively, larger voids may be preferred for other applications, so that in some examples, the one or more voids have a smallest dimension between 1 μm and 1 mm.

In some embodiments, the sample of microstructured material is fabricated from one or more of: glass materials, plastics materials, ceramic materials, semiconductor materials and metallic materials. Considering also the range of semiconductor materials available, many combinations of microstructured and semiconductor material are possible, leading to a myriad array of metamaterial devices with a huge range of features and applications. This is possible in part due to the particular nature of many high pressure fluids, which means that any semiconductor can be carried and delivered into the voids, either directly or via a precursor material.

Deposition of the semiconductor is very versatile and in many cases can be closely controlled to allow accurate tailoring of the semiconductor into desired structures. Control of this process includes varying of the time, high pressure flow rate, semiconductor concentration, and spatial definition by providing conditions for causing deposition that correspond to a desired deposition pattern. For example, the semiconductor may be deposited to form one or more nanoparticles. Alternatively, the semiconductor may be deposited to form an annular layer. Preferably, the method further comprises controlling the amount of semiconductor that is deposited to form an annular layer of a selected thickness. For example, the annular layer comprises a thin film, or alternatively the thickness of the annular layer is selected to reduce the width of the one or more voids to a selected size.

For increased structural complexity, the method may further comprise providing a further high pressure fluid comprising a further semiconductor and passing the further high pressure fluid through the one or more voids to cause the further semiconductor to deposit on the semiconductor previously deposited. This allows layered or overlain structures to be fabricated, thus increasing the range of metamaterials that can be produced. For example, after controlling the thickness of first layer to reach a selected void size, as mentioned above, the method may further comprise providing a further high pressure fluid comprising a further semiconductor and passing the further high pressure fluid through the one or more voids to cause the further semiconductor to deposit on the semiconductor previously deposited, in which the selected size of the one or more voids is such as to cause quantum confinement in the deposited further semiconductor. Nanowires and the like can thereby be fabricated using engineered materials that have a fundamental void size too large for quantum effects.

Having further regard to deposition, the semiconductor may be deposited on a surface of the one or more voids until the one or more voids is substantially filled with the semiconductor. This allows wire-like structures to be created, including nanowires if the void is suitably dimensioned for quantum confinement. Filling of voids on a larger scale may also be useful, for example to fabricate semiconductor waveguides. Further in this regard, but not limited to filling of the voids, the semiconductor may be deposited to create one or more quantum structures.

Deposition of the semiconductor can be achieved in many ways, the choice of which will depend on factors such as the materials involved, the environmental conditions achievable, the degree of controllability needed, and the desired end result. One example involves causing the semiconductor to deposit by heating the high pressure fluid as it passes through the one or more voids to cause the semiconductor to separate from the carrier fluid and deposit. Spatial patterning or quantity control of the semiconductor can be achieved by heating the high pressure fluid by heating selected portions of the sample for selected durations to control an amount of semiconductor that becomes deposited. In this way, particular semiconductor structures can be fabricated, with precise control. For example, heating the high pressure fluid may comprise applying a temperature gradient along all or part of the sample. This allows the deposition rate to be steadily increased or decreased along the sample length, which can be used to deposit a varying thickness of semiconductor, or to compensate for any tendency for the deposition to be heavier at one end of the sample than the other. The temperature gradient may be dynamically varying, or static. The choice will depend on the heating sources available, and the complexity of the gradient.

According to some embodiments, heating the high pressure fluid comprises heating a portion of the sample to create a heated zone, and moving the heated zone along the sample to deposit the semiconductor sequentially along all or part of the sample. This allows a long deposit to be formed from a compact heat source, and also allows spatial patterning to be produced if the amount of heating is varied as the zone is moved, for example by moving the zone at a non-constant rate, or varying the power of the heat source. A travelling heated zone can also be employed for deposition techniques using alloys. In one embodiment, the method further comprises implanting a plug of alloy-forming material in the one or more voids before passing the high pressure fluid through the one or more voids, passing the high pressure fluid through the one or more voids and allowing an alloy to form from the semiconductor and the alloy-forming material in the heated zone, the alloy depositing the semiconductor in response to the heat.

Pressure may be used to cause deposition, perhaps in conjunction with heating. Therefore, causing the semiconductor to deposit may comprise altering the pressure of the high pressure fluid as it passes through the one or more voids to cause the semiconductor to separate from the carrier fluid and deposit. For some applications, causing the semiconductor to deposit may comprise applying a pressure gradient along all or part of the sample as the high pressure fluid is passed through the one or more voids. A pressure gradient can provide the same type of deposition control as a temperature gradient. Further, a concentration gradient can be used, either alone or with other gradients. Therefore, in some embodiments, causing the semiconductor to deposit may comprise applying a gradient in concentration of the semiconductor in the high pressure fluid along all or part of the sample as the high pressure fluid is passed through the one or more voids.

The deposition process can be enhanced by exploiting any diffusion properties of the materials involved. For example, causing the semiconductor to deposit may comprise providing a carrier fluid that can diffuse through the engineered microstructured material, and allowing the carrier fluid to diffuse through walls of the one or more voids to leave the semiconductor within the one or more voids. Preferably, the carrier fluid can further diffuse through the deposited semiconductor. This allows continued delivery of the semiconductor even as the voids fill up, since the carrier fluid can continue to move away from the integration site and by replaced by fresh high pressure fluid. The same advantage can be provided if, additionally or alternatively, the semiconductor has a precursor form in the high pressure fluid, and causing the semiconductor to deposit comprises decomposing the precursor into the semiconductor and a by-product that can diffuse through the engineered microstructured material, and allowing the by-product to diffuse through walls of the one or more voids. In particular, the precursor may be a hydride of the semiconductor so that the by-product is hydrogen. This is useful in combination with a silica sample, since hydrogen can diffuse through silica.

Seeded growth deposition may also be employed, in which case causing the semiconductor to deposit may comprise providing a semiconductor that will grow from a seed, and incorporating a seed into the one or more voids so that the semiconductor will grow within the one or more voids as the high pressure fluid passes through the one or more voids.

Other deposition mechanisms can be used as convenient, by applying conditions which cause the deposition to occur to the sample as the high pressure fluid is passed through it. For any such mechanism, causing the semiconductor to deposit may comprise applying one or more deposition-causing conditions to the sample that vary along a gradient over all or part of the sample.

A wide range of carrier fluids can be used, with selection thereof depending on the other materials involved. For some applications, an inert carrier fluid will be desirable, to avoid unwanted interactions with the semiconductor and the sample material. For example, the carrier fluid may be argon. Alternatively, the carrier fluid may be helium or hydrogen. These latter are of especial use for methods relying on diffusion, since helium and hydrogen can diffuse through silica.

A second aspect of the present invention is directed to a metamaterial comprising a sample of elongate engineered microstructured material having one or more elongate voids running substantially the length of the sample and semiconductor deposited on one or more surfaces of the one or more elongate voids. The semiconductor may define one or more quantum structures, or the semiconductor may be deposited as one or more annular layers. Further, the semiconductor may substantially fill one or more of the one or more elongate voids.

BRIEF DESCRIPTION OF THE DRAWINGS

For a better understanding of the invention and to show how the same may be carried into effect reference is now made by way of example to the accompanying drawings in which.

DETAILED DESCRIPTION

Figure 1:
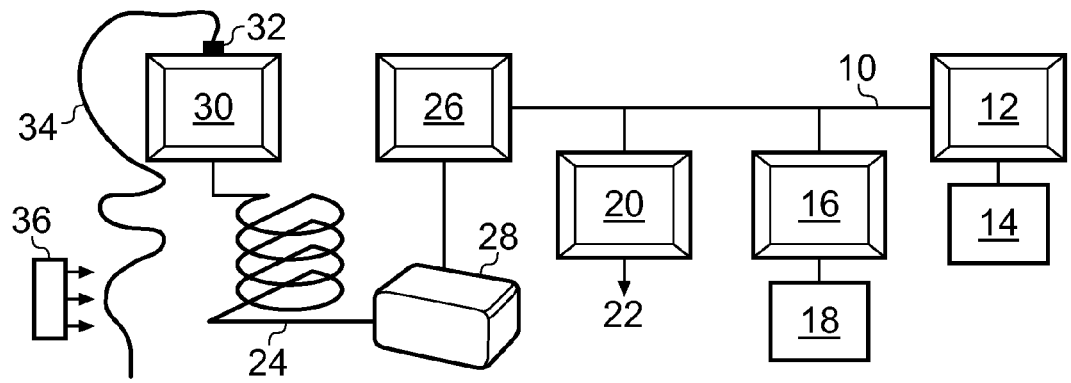
FIG. 1 shows a schematic representation of a example apparatus suitable for implement embodiments of the present invention.

A supercritical fluid is a substance that has been heated and pressurized above its critical point (defined by a critical temperature and a critical pressure). Above the critical point, the substance enters the supercritical phase, where it has properties intermediate between those of a gas and a liquid. Density is similar to that of a liquid, but viscosity, diffusivity and surface tension are like those of a gas, which are typically much higher than for a liquid. Therefore, a supercritical fluid can readily penetrate porous solids. Its solvating power can be that of a liquid, however.

This combination of properties means that supercritical fluids have proved popular as solvents, with the additional benefit that many are free from the environmental and health problems of traditional organic solvents. In this regard, they are widely used in extraction processes such as the extraction of caffeine from coffee beans. Also, the solvating properties allow deposition to be performed, where the supercritical fluid carries a material to be deposited to a deposition site. For example, silicon nanowires have been grown in a supercritical solution of hexane using a diphenylsilane precursor and gold nanocrystals to seed the silicon growth [8]. This resulted in bulk quantities of 5 nm diameter silicon nanowires grown to a length of several microns. Visible photoluminescence was observed and attributed to quantum confinement techniques. Other supercritical fluid deposition work has produced silicon and germanium nanowires formed within chemically formed and self-assembled mesoporous silica templates having uni-directional arrays of pores less than 15 nm in diameter and over 1 µm in length [9]. Copper and nickel films have also been created by supercritical fluid deposition, using supercritical carbon dioxide to deposit the metals onto sub-micron lithographically patterned silicon substrates [10].

Investigation of the results of the above work has shown that supercritical deposition in these circumstances is of good quality and can offer reaction rates several orders of magnitude higher than those offered by conventional techniques such as chemical vapour deposition. However, while the resulting structures are of great interest, surface patterned substrates and self-assembled structures are of limited use for photonics applications, in which it is highly desirable that the various structured devices currently available be enhanced and engineered by the provision of additional materials, in particular the incorporation of semiconductors into waveguide devices such as holey fibres.

To address this, the present invention exploits the properties of high pressure fluids, including supercritical fluids, by recognizing that they can be used to great advantage to carry semiconductor materials into elongate voids or holes of a microstructured material such as a holey fibre, where the semiconductor materials are deposited within the voids, with the aim of modifying the microstructured material so as to provide a new structure or new physical properties. This is a surprising result, because the assumption is that the regularity and high aspect ratio of elongate voids in engineered material precludes quality deposition, in that deposition would be uneven and materials would not be carried along the full extent of a void. In general, it is understood there are considerable challenges associated with mass transport of precursors such as semiconductors to a reaction zone within an extreme aspect ratio capillary or channel, because the rate of flow of material within the channel is limited. Furthermore, if reaction by-products form at the reaction zone, further transport of fresh precursor to enable further reaction is inhibited. Thus existing approaches for depositing semiconductors within extreme aspect ratio structures have been limited to relatively short length scales by the lack of a suitable means to transport semiconductor precursor to the reaction zone.

The present invention therefore explores a new direction in metamaterials research since it exploits elongate artificially engineered microstructured materials as ideal configurable templates for the embedding of semiconductors. It offers radical enhancement of the complexity and functionality of such devices, in particular holey fibres, with a view to creating a platform photonics technology. The invention has the potential to fundamentally impact the way that optical fibres are used.

The invention will now be described in detail. In the following description, the following terms will be used and should be understood as follows:

Microstructured material: a structured material containing voids, where the voids have smallest dimensions on the micrometer scale (1 µm to 1 mm) or nanometer scale (1 nm to 1 µm; such materials are also known as nanostructured materials).

Void: a hole, cavity, channel, capillary or similar having a smallest dimension on the micrometer or nanometer scale. The invention is directed to elongate microstructured materials such as holey optical fibre in which the voids run along the length of the material, so the voids are elongate with a high aspect ratio, in that they have a length very much greater than their width (typically orders of magnitude higher).

Engineered: the microstructured material to which the present invention is applicable is fabricated or artificially engineered so as to achieve a desired spatial structure, particularly in terms of the size, quantity, regularity and arrangement of the voids. Any arbitrary structural complexity can be achieved. This is distinct from a self-assembled material, which is chemically grown and in which it is therefore difficult to impose a specific pattern of voids, and in which the structure typically has only short range order so is unsuitable for electronic or photonic applications. Also the voids of a self-assembled material do not have a high aspect ratio.

Metamaterial: the end result of a method according to the present invention, comprising a sample of engineered microstructured material in which a semiconductor material has been deposited.

High pressure fluid: although the invention is largely concerned with using supercritical fluids to deposit the semiconductor, comparable results can be achieved using fluids having a temperature and/or pressure outside this regime, particularly fluids which are just below the supercritical regime, having temperatures and pressures in the vicinity of the critical point, and further using high pressure fluids in general. Therefore, the invention extends to the use of high pressure fluids in general, and is not limited to supercritical fluids. By "high pressure" it is meant that the fluid has a pressure of 1 MPa or higher. Thus, throughout this description, the term "supercritical fluid" is to be understood as including suitably high pressure fluids that may be outside of the supercritical phase, and the term "high pressure fluid" is to be understood as including supercritical fluid, unless stated otherwise.

Carried: the high pressure fluid carries the semiconductor material into the voids of the engineered microstructured material. This can be achieved in many ways, depending on the nature of the materials involved, and how they react (or not) together. Thus the semiconductor may be dissolved, suspended, mixed with or otherwise incorporated; "carried" is intended to include all possibilities. Further, the semiconductor material may be a constituent of a more complex material that is itself carried, and the semiconductor per se is provided by causing a reaction that liberates the semiconductor from the complex material, thus allowing deposition to occur. This is intended to include the use of precursor materials to provide the semiconductor, where the precursor is carried by the high pressure fluid and once inside the voids is converted into the actual semiconductor which is then available for deposition. The precursor decomposes into the semiconductor and a by-product, the semiconductor is deposited and the by-product removed, perhaps by being carried away by the carrier fluid. Thus, reference to the semiconductor being carried by the carrier fluid includes instances where the semiconductor has a different form when carried to the form in which it is finally deposited, as well as cases in which the semiconductor is carried directly in its depositable form.

For the purposes of describing the invention, holey fibre will be used as an example of an engineered microstructured material with elongate, high aspect ratio voids. The voids in holey fibres constitute an array of air holes that extend along the length of the fibre and define the fibre's transverse refractive index profile. Appropriate selection of the size, position and quantity of the holes is used to tailor the refractive index and give many desirable properties to the fibre such as endless single mode propagation and high nonlinearity. The holes are elongate, having diameters on the micron scale, and more recently on the nanometer scale, and lengths as long as is possible to fabricate the fibre. For the purposes of the present invention, a sample of holey fibre of a length appropriate for the device being fabricated may be used; it is expected that such lengths will typically be of millimeter, centimeter, meter or kilometer dimensions. High pressure fluid, in particular supercritical fluid, can readily propagate along the holes for these lengths, and it has been found that semiconductor material carried by the fluid is evenly and uniformly deposited within the voids.

However, holey fibre is used here merely as an example, and it is to be understood that the invention extends to other microstructured materials having elongate voids, such as planar samples possibly intended as channel or other planar waveguides, or alternative elongate configurations, such as ribbon fibre arrangements containing arrays of cavities. The invention is well suited for depositing semiconductor material into elongate voids with a high aspect ratio, since the high pressure fluid can readily penetrate into very narrow holes and still flow along the entire length of the hole. Even very narrow voids, with widths on the nanometer scale, can have semiconductor material deposited using the present invention. Thus, the voids may have dimensions such that they have a width of 1 nm to 100 nm but a longer length, such as a ratio of length to width (aspect ratio) in the range 100:1 to 1000:1, 100:1 to 10000:1, 100:1 to 100000:1, and on through more extreme aspect ratios of $10^6$:1, $10^7$:1, $10^8$:1, $10^9$:1, $10^{10}$:1, $10^{11}$:1, or $10^{12}$:1. This last very extreme aspect ratio corresponds to a cross-sectional area of 1 $nm^2$ and a 1 km length. The lower end of the range may be larger than 100:1, for example it may be 1000:1, 10000:1 or 100000:1. However, the voids are not limited to such tiny cross-sections, and larger sizes with void widths of between 1 nm and 1 μm or between 1 μm and 1 mm are also included.

Each material is able to transmit electromagnetic radiation, i.e. is transparent to electromagnetic radiation; this is frequently achieved by the provision of the voids, although in some cases, the material may have a structure or physical nature that allows it to be transmissive, and the holes are supplemental to this, or possibly even incidental. For example, the voids may be provided specifically for deposition of semiconductor material according to the present invention, to provide functional features for a device.

A particular application of the invention is the fabrication of metamaterials that are also mesomaterials. A mesomaterial is one in which quantum effects can be exploited by structures on the nanometer scale, for example a carbon nanotube. Thus, under the correct conditions (typically a certain temperature regime) it demonstrates behavior somewhere between nanotechnology and full quantum mechanics. Using an appropriate combination of engineered microstructured material having an array of nanoscale voids and made from a suitable material, and semiconductor material, a metamaterial made according to the present invention can have the form of a mesomaterial. The microstructured material should have a mesoporous structure, in which the voids are small enough to contain a wavefunction so that quantum effects can be observed.

Regarding materials, many are suitable for fabrication of such engineered microstructures, and will be selected according to the intended use to which the resulting metamaterial is to be put. Examples include glass materials, plastics materials, ceramic materials, semiconductor materials and metallic materials.

Thus, a sample of engineered microstructured material, in this example a piece of holey fibre, is provided.

Secondly, the supercritical/high pressure fluid is provided, comprising a carrier fluid carrying a semiconductor material. The term "fluid" includes liquids and gases, depending on the materials, pressures and temperatures used. Many fluids are suitable for use as a carrier fluid; all that is necessary is that the fluid can be heated and pressurized into or near to its supercritical state or phase, or to a generally high pressure under conditions that can be achieved for the particular application of the present invention. For some applications an inert fluid is appropriate so that the semiconductor material can be carried and deposited without interaction between the carrier fluid and the semiconductor or the carrier fluid and the microstructured material. However, in some cases such reaction might be desirable, for example to achieve a particular integration, in which case the carrier fluid can be selected accordingly. Carbon dioxide is widely used as a supercritical fluid and is suitable for use with the present invention. Also, argon, helium and hydrogen are particularly suitable for some applications. Other fluids are not precluded, however. The pressure of the fluid should be at or above 1 MPa. The choice of pressure will depend on the overall process conditions and materials, but may be in part selected with regard to the size of the voids, since higher pressures can deposit semiconductor over longer distances in narrower voids. Therefore, according to various embodiments, the pressure of the high pressure fluid is at or above 2.5 MPa, 5 MPa, 10 MPa, 25 MPa, 50 MPa, 100 MPa, 500 MPa, 1000 MPa or 2000 MPa. These pressures may or may not take a particular carrier fluid into its supercritical phase. For example, the critical pressure of carbon dioxide is 7.4 MPa. It is possible to work far above the critical pressure, since this gives all the advantages of supercritical fluids plus the increased penetrating ability that comes generally with increasing the fluid pressure.

Similarly, any semiconductor material can be deposited using the present invention. Any material that can be suitably carried by a high pressure into the voids of the microstructured material can be used (although it may thus be necessary to match a particular semiconductor material with a particular carrier fluid). This points to the great versatility and wide applicability of the present invention; using high pressure fluids it is possible to deposit a range of semiconductors. Combined with the wide range of materials from which the microstructured sample can be made, many different metamaterials can therefore be fabricated, that have often not previously been possible, and having an enormous number of applications.

FIG. 1 shows an example of apparatus suitable for implementing embodiments of the present invention. The apparatus comprises a gas manifold 10 having three high pressure valves (for example, capable of holding 30,000 psi). A first valve 12 is an inlet valve connected to a cylinder 14 containing carrier fluid (as a liquid or a gas), and a second valve 16 is an inlet valve connected to a cylinder 18 containing gaseous semiconductor (or semiconductor precursor). The carrier fluid may initially be either at high pressure or at more modest pressures as low as just above atmospheric pressure. The third valve 20 connects the manifold 10 to a vacuum line 22.

The manifold 10 is connected to a first end of a condenser coil 24 via a first high pressure valve 26 (preferably capable of holding 100,000 psi) and a high pressure gauge 28. The condenser coil is preferably also rated to 100,000 psi. A second end of the condenser coil terminates in a second high pressure valve 30 (again preferably capable of holding 100,000 psi) fitted with a high pressure fitting 32 (preferably capable of holding in excess of 5,000 psi). The high pressure fitting 32 is designed to receive an end of an elongate sample of microstructured material 34, for example a holey fibre, in such a way that fluid may flow from the condenser coil 24 and into the voids of the sample. Finally a heat source 36 is arranged such that all or some of the sample can be heated.

The apparatus is operated by inserting the sample into the high pressure fitting 32. Measured amounts of the carrier fluid and the semiconductor material together pass through the first high pressure valve 26 and into a closed condenser coil 24 wherein the gases are condensed by cooling the coil 24 in liquid nitrogen. This produces a condensed mixture, which may have considerably higher density than the initial densities of either the carrier fluid or the semiconductor material/precursor. The first valve 26 is closed and the mixture is warmed to room temperature, resulting in an increase in pressure of the mixture, to the desired high pressure to form a high pressure fluid. This then leaves the coil 24 by way of the second high pressure valve 30 and passes into the voids of the sample 34.

In this particular example, the deposition of the semiconductor material is achieved by heat, which causes some or all of the semiconductor to separate from the carrier fluid (by conversion from its precursor if a precursor is used) and deposit on the inner surface of the voids of the holey fibre. Therefore, an external heat source 36 is arranged to apply heat to the fibre 34 so that semiconductor material is deposited in the heated region. The remaining high pressure fluid, containing any undeposited semiconductor, passes along the length of the holes and leaves the holey fibre at its far end.

To achieve deposition over a long distance, the heat source 34 and the fibre 12 can be arranged to move relative to one another. In this way, successive portions of fibre can be heated sequentially, so that the semiconductor gradually deposits over the desired extent of the holes. Varying the speed of the relative movement can vary the amount of semiconductor deposited at a particular location, so that the thickness of the deposit can be controlled to build up a desired structure. Alternatively, selected regions of fibre can be heated to provide localized deposition.

This is a simple apparatus for implementing the invention, and is presented as an example only. Any apparatus by which the carrier fluid and the semiconductor can be suitably pressurized and then delivered to the microstructured voids can be used. Further, the external heat source 36 will typically only be included for those material combinations and deposition mechanisms that require heat application to cause or enhance the semiconductor material to deposit. Also, the heating may not be performed to produce high temperatures. In some embodiments, the semiconductor may be provided by a precursor that is unstable at room temperature and thus may initially need to be at a low temperature. The heating to induce the deposition then amounts to warming the high pressure fluid within the voids to room temperature, to cause instability of the precursor so the semiconductor is available for deposition. Other examples may use cooling to achieve a similar effect. The external heat source 36 may be dispensed with or replaced by other apparatus as required by the deposition mechanism of interest.

An alternative apparatus may be based on an autoclave arrangement. Instead of forming the high pressure fluid and injecting or otherwise flowing it into the voids of the sample, the entire sample can be immersed in the high pressure fluid within a pressure chamber. The high pressure fluid will then penetrate into every open void in the sample. Heating of the high pressure fluid within the voids to cause the deposition (if such heating is necessary) can then be provided in any convenient manner, such as by inductive heating methods which can provide the necessary localized heating to limit the heating to the sample.

Continuing with the example in which the semiconductor material deposits on the inner surface of the voids, in many cases this can be achieved by using a precursor, and causing deposition by applying the necessary conditions to the high pressure fluid in the voids to decompose the precursor, such as heating or application of a particular chemical or pressure. The conditions will depend on the precursor. A range of precursor chemistries are available for a variety of semiconductors. Many of these chemistries have been developed for use in conventional chemical vapour deposition techniques operating at or near atmospheric pressure, but will function in a similar manner in the high pressure regime of the present invention.

Various semiconductor structures can be achieved using deposition. The deposition mechanism may be such that initially the semiconductor deposits as nanoparticles, which over time accumulate to form an annular layer around the inner surface of the void. The thickness of the layer builds with time, as more high pressure fluid is passed through the voids. Thus, the layer thickness can be controlled by controlling the time for which the high pressure fluid is passed (assuming that appropriate heat is applied if necessary to cause the deposition). Alternatively, a greater concentration of semiconductor might be provided so that more can be deposited per unit time, the flow rate of the high pressure fluid might be modified, and/or parameters that modify the rate of deposition, such as the temperature, might be adjusted. In this way, a layer of a desired thickness can be built up. Other deposition mechanisms can also be employed, such as those giving uniform film growth instead of initial deposition as particles.

Figure 2A:
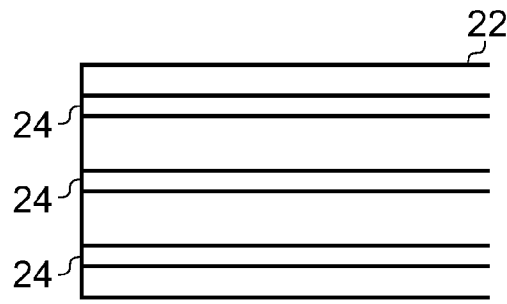
FIGS. 2A, 2B and 2C show cross-sectional views of portions of holey optical fibre with semiconductor deposited therein according to embodiments of the present invention.
Figure 2B:
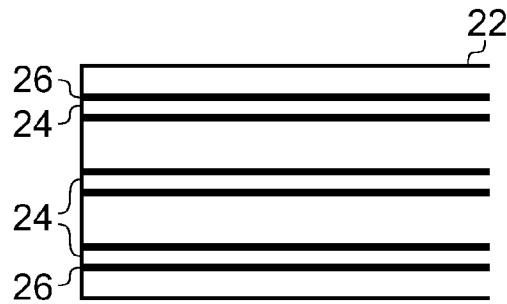
Figure 2C:
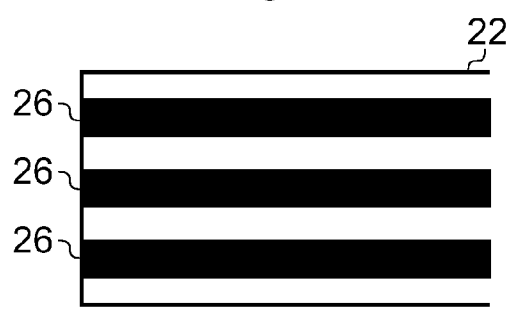

FIG. 2A shows a simplified longitudinal cross-section through an end of a holey fibre 22, showing three holes 24. FIG. 2B shows the same fibre 22 with a layer of semiconductor 26 deposited on the inner surface of each hole 24. The thickness of the layer might be such as to provide a thin film of semiconductor, for example, or a more substantial layer. Alternatively, the deposition may be allowed to continue, until the holes 24 are completely filled with semiconductor 26, as shown in FIG. 2C. The filling is possible because of the high diffusivity and low surface tension of the high pressure fluid, which allows it to continue to flow even where only a very small opening remains. The filling may be used, for example, to provide wire-like structures. Further, one-dimensional quantum nanowires can be created using deposition filling, if the void is small enough to provide quantum confinement of the semiconductor.

Figure 2D:
FIGS. 2D and 2E show cross-sectional views of portions of holey optical fibre with semiconductor deposited therein according to further embodiments of the present invention.
Figure 2E:
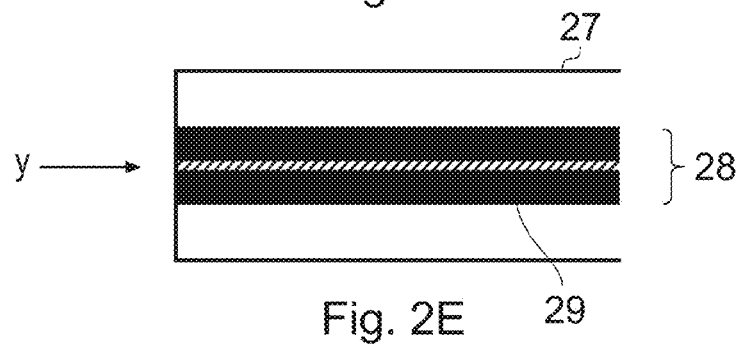

Further in this regard, controlling the thickness of the deposited layer can be used to produce a void with a particular width, since the deposition process can be considered as reducing the void width. This can be particularly useful if an engineered microstructured material with a required void size is not available or is difficult to make using conventional fabrication techniques. Also, different voids within the same sample can be tailored to different widths. This is of especial interest for nanowire fabrication, since the very small void width necessary to produce quantum confinement can be achieved by depositing a material inside a void of a width that is too large to give confinement but which is easier to engineer, to reduce the void width to the required dimension. Then, a further high pressure fluid comprising a different semiconductor material (but possibly the same carrier fluid) is passed through the reduced void and deposited to fill the remaining space and create a nanowire. FIG. 2D shows cross-section through the end of a fibre 27 having a hole 28 that is too large for quantum confinement, but which is reduced in size by a layer of semiconductor X; Then, as shown in FIG. 2E, a second semiconductor Y is deposited to fill the void, thereby forming a nanowire 29.

Other layered structures of two or more layers or other overlain structures can be fabricated in this way, by using various high pressure fluids to deposit successive semiconductors to selected thicknesses.

Regarding control of the rate of flow of the high pressure fluid, and the density, these can be increased by using higher pressures. The tiny dimensions of the microstructured voids allow extreme high pressures (thousands of atmospheres or more) to be used if desired. In the case of holey fibre, it is possible to make fibre with a tensile strength well in excess of that of steel. Combined with the small void dimensions, this means that a single hole in a fibre can be pressurized to levels of 100,000 psi or above. However, this is well within safety limits for working with high pressures (250 bar liters in the United Kingdom, for example), as the potential energy contained within the tiny volume of the hole is negligible. This greatly lowers the cost of using high pressures. Hence, higher deposition rates can be achieved safely and cheaply.

To demonstrate the principles of the invention, initial experiments under the simple conditions were performed using the apparatus of FIG. 1 to deposit germanium within a silica capillary. A length (approximately 1 meter) of capillary with a ~2 μm internal diameter and approximately 125 μm external diameter (after stripping off a polymer coating) was inserted into the high pressure fitting 32. The apparatus comprises components suitable for fibre filling experiments, as gases are condensed into the portable high pressure closed system, and then are allowed to flow into the silica capillary where the deposition reaction occurs. 241.5 psi of germanium was condensed into the coil, along with 3458.5 psi argon to create a 6.5% Ge:93.5% Ar mixture. Initially, this high pressure mixture was passed into the attached silica capillary and allowed to flow through into a beaker of solvent. Gas bubbles were observed, demonstrating that no blockages were present in the capillary. Upon heating a 2-3 cm section of the capillary to >400° C. whilst maintaining high pressure fluid flow, it was observed that the capillary channel turned black at that place.

This section of the capillary was subsequently placed in a Raman spectrometer and compared with 99.999% pure germanium powder. The results of the spectrometry indicated a Raman shift of 300.9 cm$^{-1}$ for the control sample of pure germanium, compared with 300.1 cm$^{-1}$ when the Raman laser was focused on the centre of the black, highly reflective capillary channel. Outside of the heated zone, an amorphous germanium peak in the capillary had a Raman shift of 265 cm$^{-1}$. These values compare with a published literature value of 300.8 cm$^{-1}$ for pure germanium. The closeness of the measurements to the literature value shows that both the control sample and the heated zone material were crystalline germanium. This indicates the deposition of high crystalline quality germanium semiconductor over a substantial length inside the silica capillary.

Figure 3:
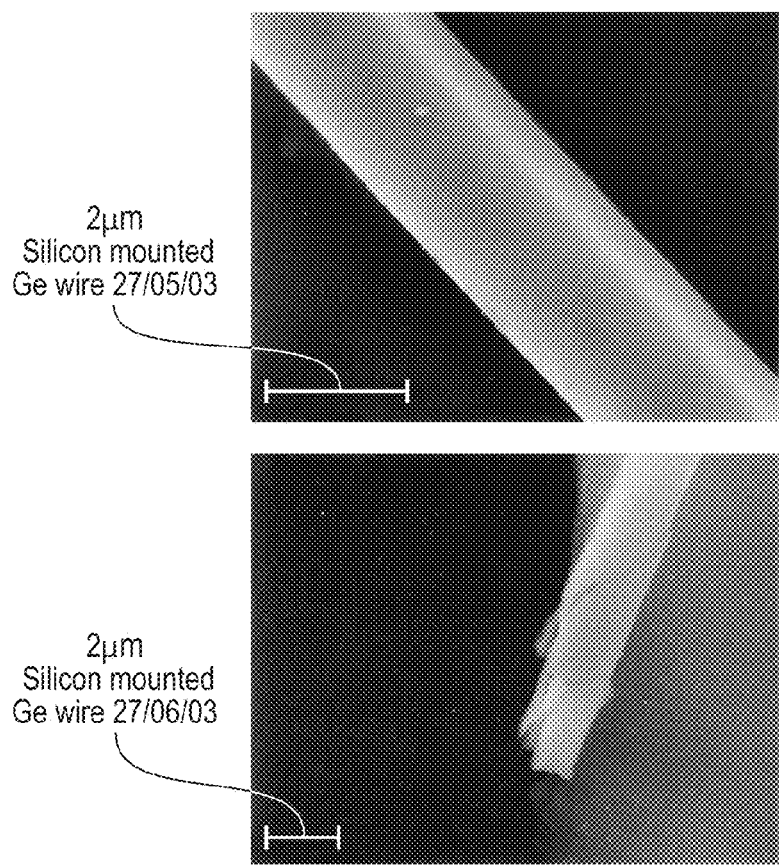
FIG. 3 shows scanning electron micrograph images of semiconductor material deposited inside a capillary in accordance with an embodiment of the present invention.

Subsequent deposition experiments were performed using an 80 cm long tube furnace. A 60 cm length of capillary was heated to 500° C., ramping to this temperature over 4 hours. Upon examination, it was noted that some 45 cm of the capillary channel was filled with germanium. A small section of the sample was etched in concentrated HF solution to remove the silica cladding, releasing a long (>10 mm) black, 2 μm wide, highly optically reflective wire or tube. FIG. 3 shows two scanning electron micrograph images of this wire.

Figure 4A:
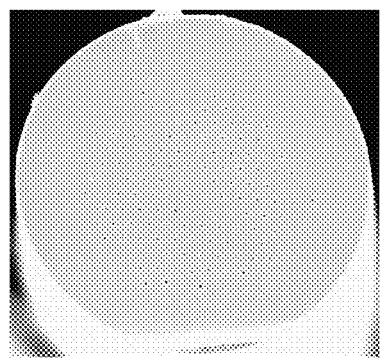
FIGS. 4A, 4B and 4C show scanning electron micrograph images of a portion of holey fibre and of semiconductor deposited in holes of the holey fibre in accordance with further embodiments of the present invention.
Figure 4B:
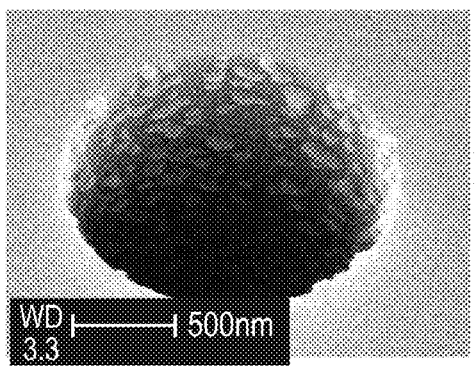
Figure 4C:
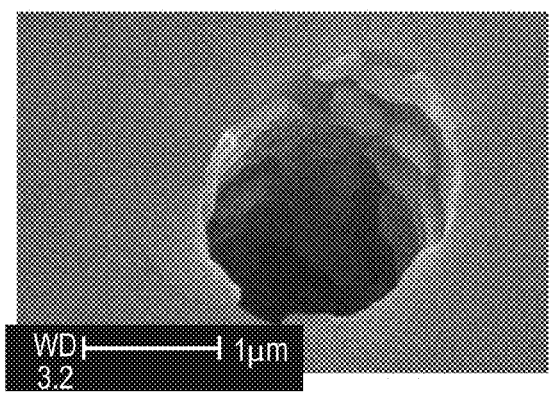

Similar experiments were then performed using a holey fibre sample to demonstrate the efficiency of the process for filling arrays of small holes with semiconductor material over long lengths. FIG. 4 shows three scanning electron micrograph images of the results, where FIG. 4A shows an end of the holey fibre sample before application of the method, FIG. 4B shows an end view of a single hole in which "islands" of germanium growth on the inner surface of the hole can be observed, and FIG. 4C shows an end view of a single hole later in the deposition process, when the islands are beginning to coalesce into thin film annular growth over the entire surface of the hole.

Figure 5:
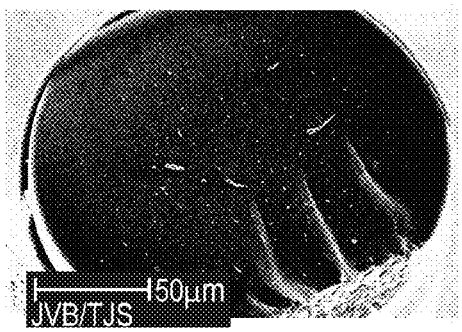
FIG. 5 shows scanning electron micrograph images of a further portion of holey fibre and of semiconductor deposited in holes of the holey fibre in accordance with yet further embodiments of the present invention.
Figure 5:
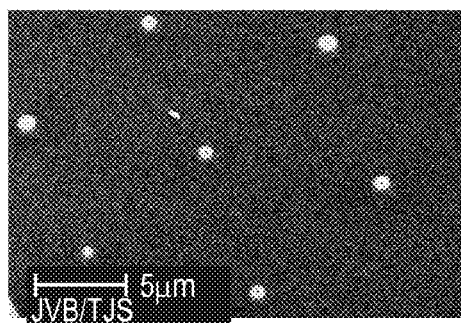
Figure 5:
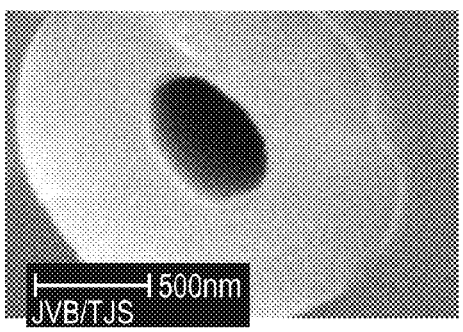
Figure 5:
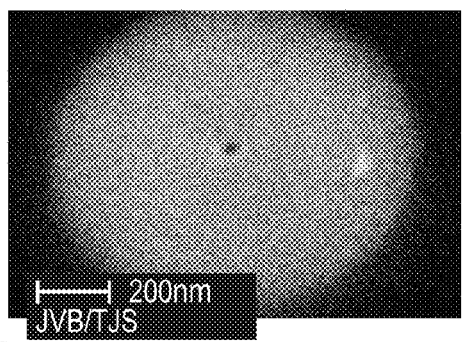
Figure 6A:
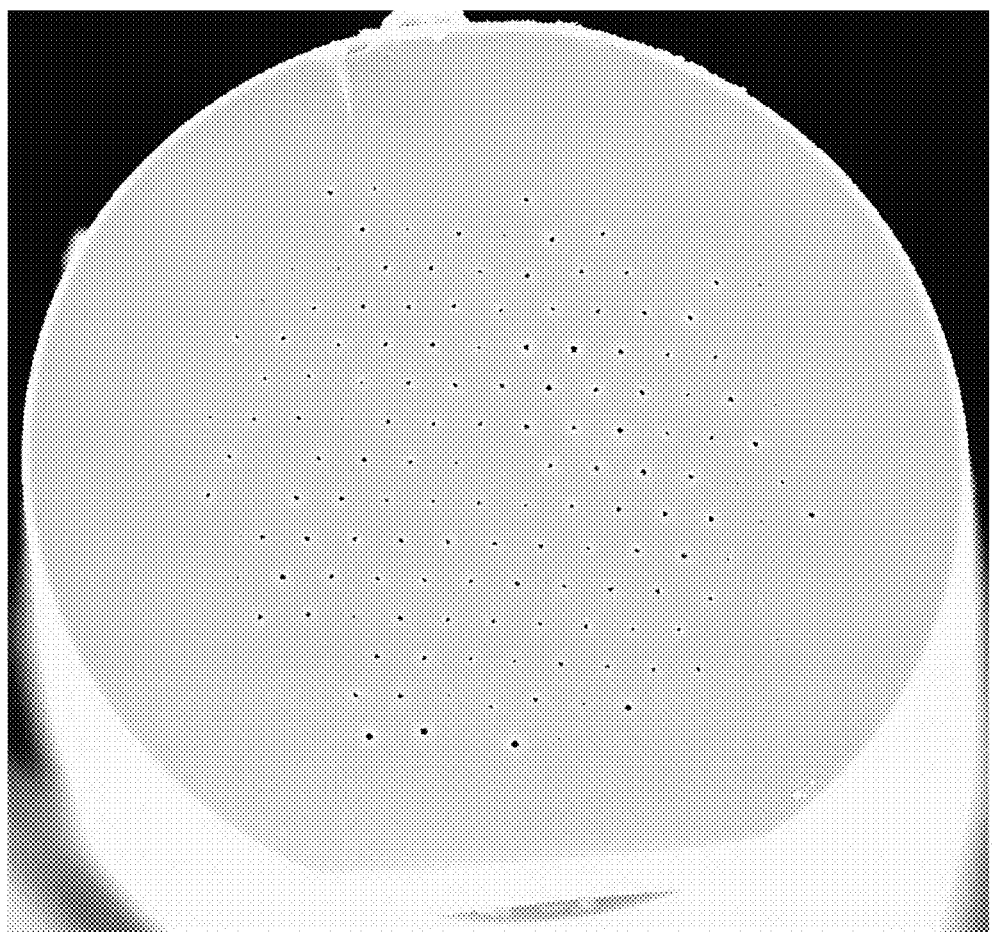
FIGS. 6A to 17C illustrate examples of the results of the use of some aspects of at least preferred embodiments of the current techniques.
Figure 6B:
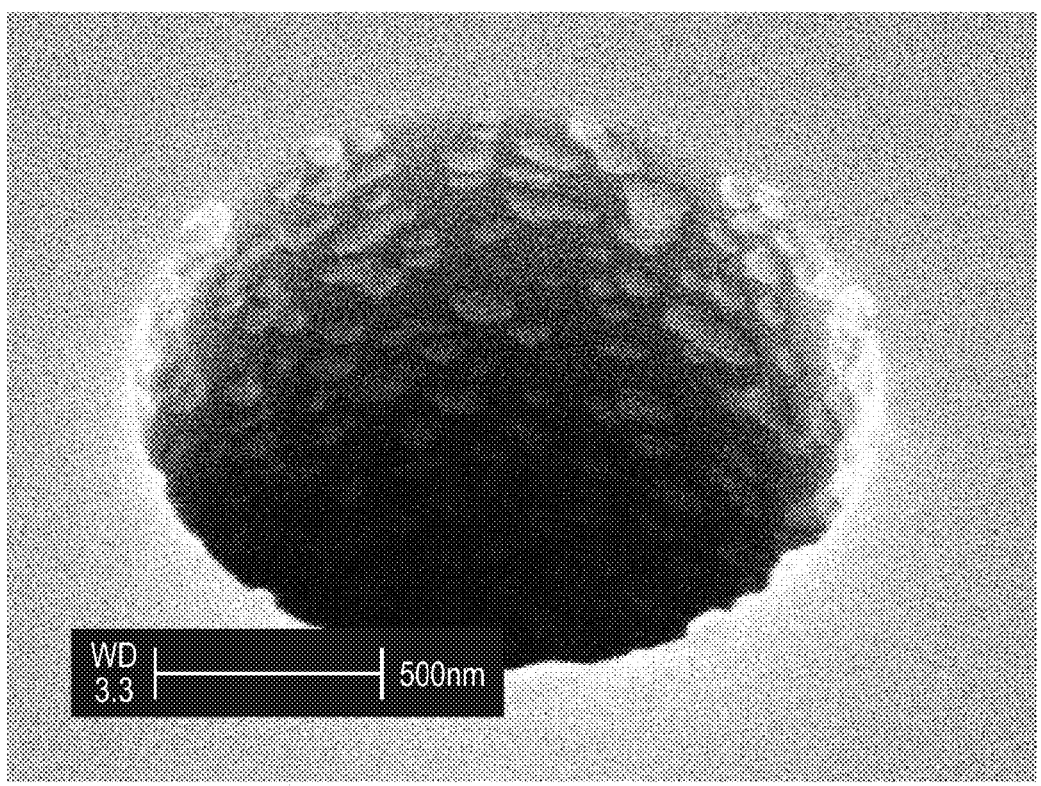
Figure 6C:
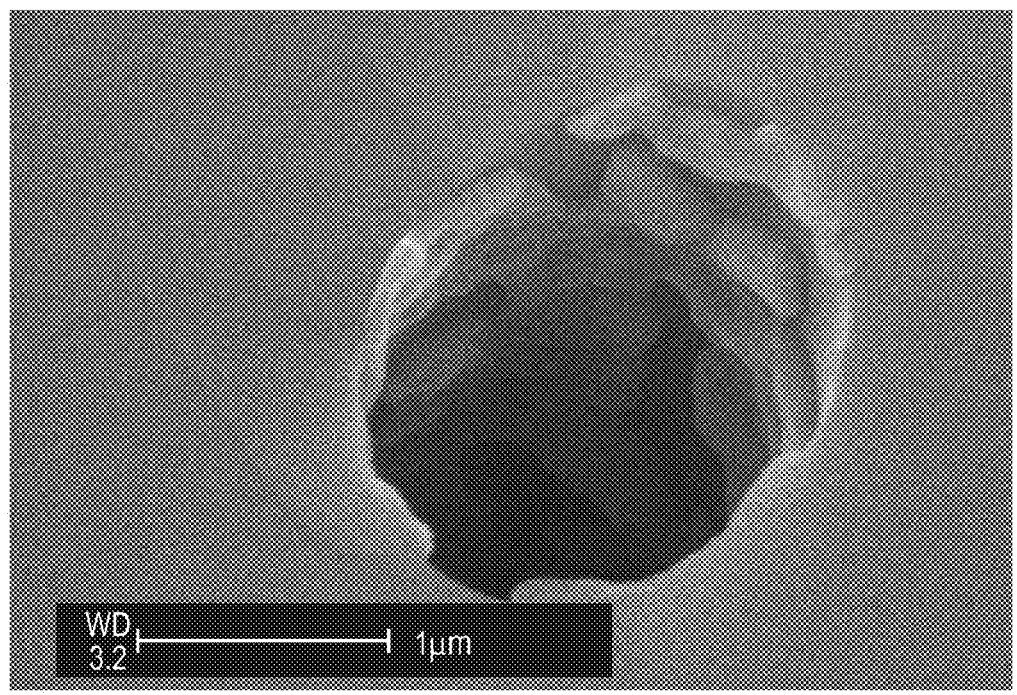
Figure 6D:
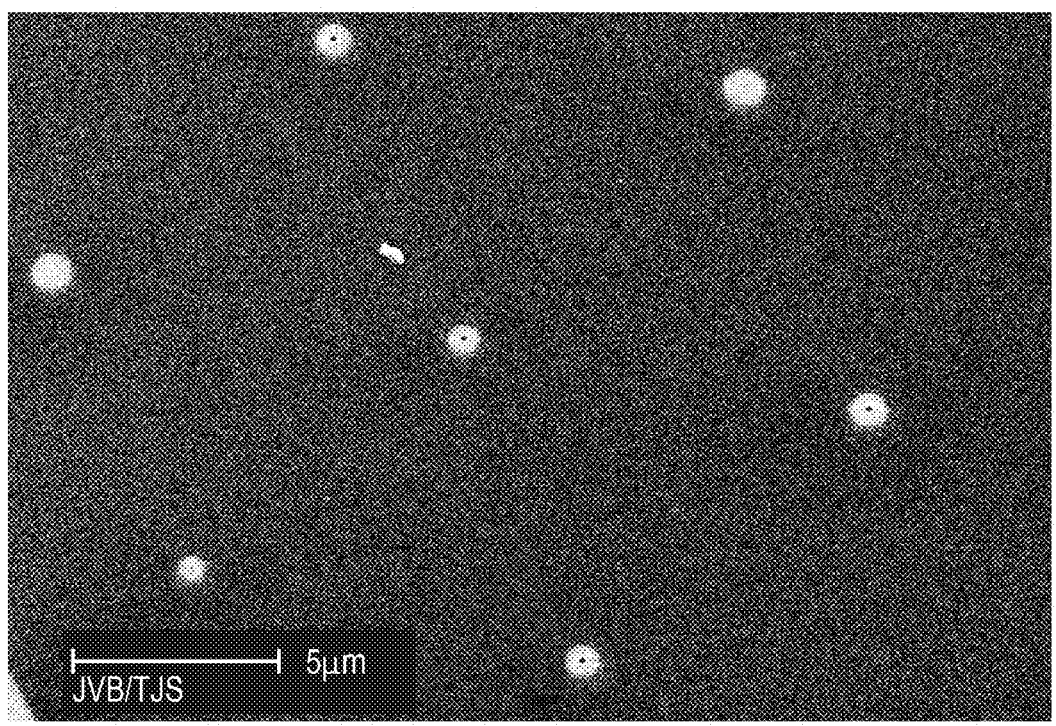
Figure 6E:
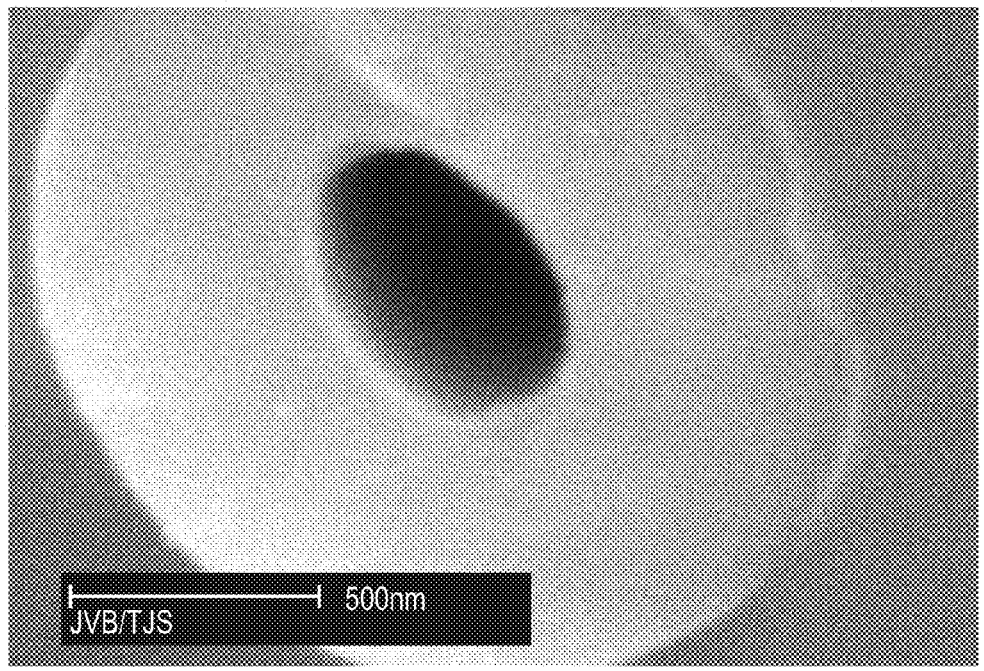
Figure 7A:
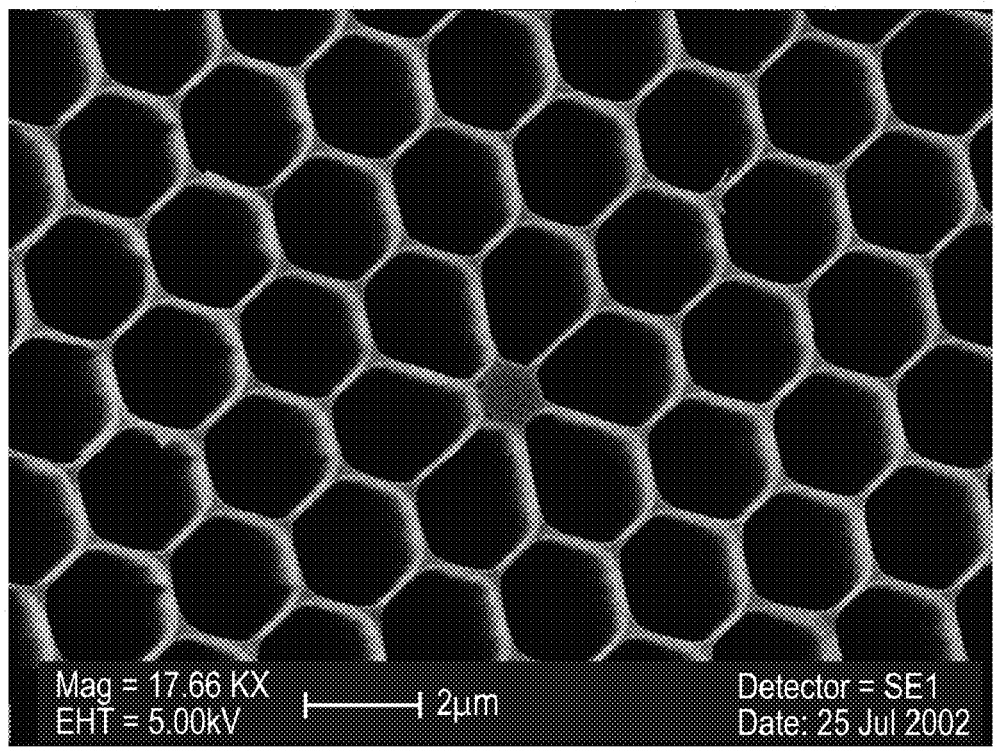
Figure 7B:
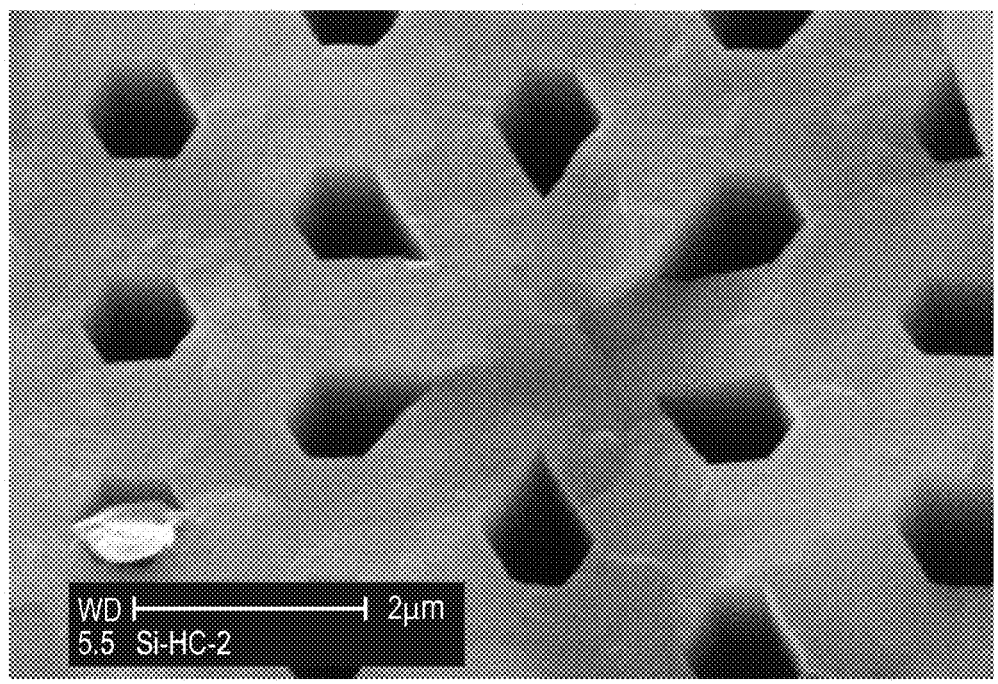
Figure 7C:
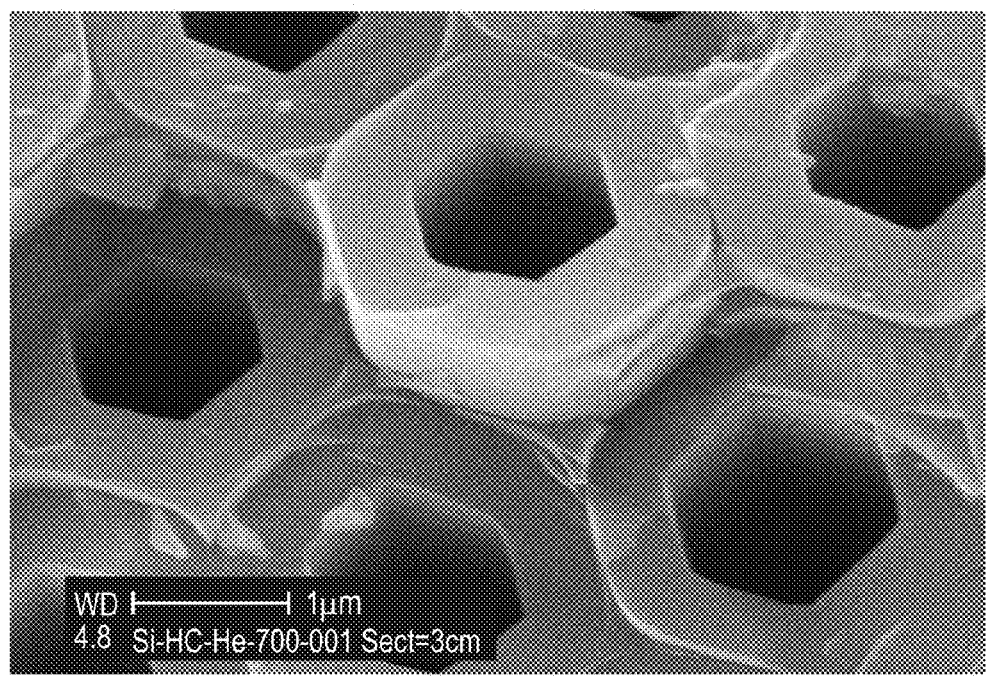
Figure 7D:
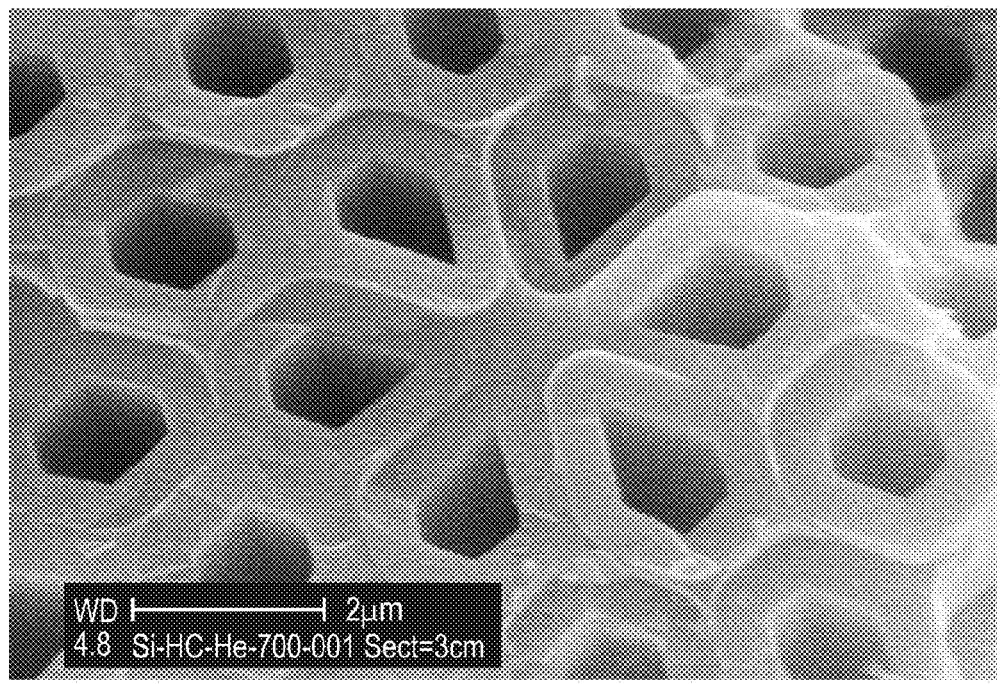

Further experiments using holey fibre demonstrate the annular growth of semiconductor material within the elongate voids. Substantial filling of the holey fibre sample has been achieved. FIG. 5 shows SEM images of the holey fibre that clearly demonstrate the extremely smooth high quality annular growth of germanium inside the fibre holes, which occurred over centimeter length scales. Micrometer sized holes can thus be reduced to a few tens of nanometers or less (i.e. nearly 100% filling). Careful control of the deposition process allows hole sizes to be tuned to a specific width and then filled with other semiconductor materials. This creates a layered structure, which, if the first deposition leaves a narrow enough aperture, can exploit quantum wire confinement in the second material.

The semiconductor deposition illustrated in FIGS. 4 and 5 was achieved without controlling parameters such as pressure gradient, ultimate temperature, concentration, temperature profile and the like. Much greater control over the physical extent of the deposition can be achieved if parameters of this type are taken into account. For example, any tendency for the deposition to occur such that the holes are either nearly or completely filled over a first portion and then gradually open up over the remainder of the length of the sample can be addressed by applying deposition-causing conditions that vary over the length of the sample, for example conditions that vary along a gradient, to produce enhanced deposition in the latter portion of the sample. This may include applying a temperature, pressure or concentration gradient over the sample length. A temperature gradient may be achieved statically, in that the whole sample is heated at once but to higher temperatures at one end than the other, or dynamically, by heating successive portions of the sample to ever greater or lesser temperatures (by altering the time for which heat is applied, for example). Dynamic variation of a temperature gradient applied along all or part of the sample is also possible, to cause greater or lesser deposition at selected locations. The technique of heating successive portions of the sample, which can be thought of as providing a heated zone which moves along the sample, may also be applied without producing a temperature gradient. In either case, the effect is to cause the deposition to progress along the sample in a sequential manner, until a desired amount of semiconductor is deposited. In this way, complete void filling or a specific layer thickness can be achieved over a great length of sample, up to meters and beyond. A concentration gradient relates to varying the concentration of the semiconductor in the high pressure fluid, for example by increasing or decreasing the concentration over time as new high pressure fluid is passed through the voids.

The growth conditions of the experiments described above utilized high pressure argon, which, although strictly speaking was in the supercritical regime, was so far above its critical point that it is not thought of as having the same density as a fluid close to its critical point. However, the extreme strength of silica fibres makes it possible to access pressure regimes of thousands of atmospheres that would be extremely difficult to access by any other means, and which allow substantial recovery (and indeed may greatly exceed) much of the critical point density of argon. Thus the advantages of extreme high pressure for the implementing the present invention can be combined with those of the critical point density.

The invention is not limited to the use of argon as the carrier fluid, however. Many fluids are suitable, depending on the semiconductor material required and the pressure and temperature regime in which it is desired to work. While having been found to give good results, the argon used in the above experiments was functioning on a very simple level, by passing into one end of the voids and out at the far end, depositing germanium en route. In the event that it is desired to substantially or completely fill a void with semiconductor, this transportation arrangement might by disadvantageous, in that it become increasingly difficult to deliver more semiconductor because the previous carrier fluid may become trapped in the void and impede the flow of further high pressure fluid. This is addressed by embodiments of the invention that utilize the diffusion properties of fluids. Some fluids suitable for use as carrier fluids are able to diffuse through the material from which the microstructured material can be made. Therefore, instead of passing through the length of the void, the carrier fluid can pass out through the walls of the void, leaving the semiconductor behind. This effect is enhanced if the carrier fluid can also diffuse through the already deposited semiconductor. Particular examples of this are hydrogen or helium gas, which can diffuse through silica, from which many suitable microstructured materials, in particular holey fibre, can be made. Therefore, some embodiments utilize hydrogen or helium as the carrier fluid. Hydrogen is of particular use in carrying germanium and silicon, for example, since a hydride ($GeH_4$, $SiH_4$) can be formed to serve as the high pressure fluid, which then decomposes to deposit the germanium or silicon, leaving hydrogen gas which can diffuse out of the silica. Alternatively, the hydride can be used as a precursor to provide the semiconductor, and a further gas can be used as the carrier fluid, if that gas is also able to diffuse through the sample material. Helium is an example. In effect, the diffusion approach can be exploited wherever the engineered sample is made from a material through which the carrier fluid and any by-product resulting from decomposition of a precursor used to provide the semiconductor (in cases where a precursor is used) can diffuse. This technique effectively allows the microstructured material to act as a "gas filter" so that material for deposition will always be transported to the deposition region even when the void is completely blocked, because the very small inert carrier gas atoms will always be able to diffuse out of the void. This approach addresses one of the key issues for deposition within extreme aspect ratio voids, since it finds a way to overcome the limited mass transport rate of fresh semiconductor or precursor to the deposition zone while enabling removal of the by-products.

Further embodiments use seeded growth of semiconductors. This is of particular use for fabricating microwires and nanowires. A seed material on which semiconductor growth can be initiated is deposited in a void or voids in the sample. Then, passage of the high pressure fluid over the seed delivers the semiconductor to the seed site, whereupon semiconductor growth occurs. Thus, the seed can be used to control the location and extent of the deposition, to achieve a desired structure.

Alternatively, alloys may be used for deposition. This will typically require the use of a travelling heated zone as described above. A small amount, perhaps a plug, of a material that can form an alloy with the semiconductor is implanted into the void, for example by electrochemical deposition or vapour deposition. Then, the high pressure fluid is passed into the void, and the semiconductor forms an alloy with the alloy-forming material. Then, as more semiconductor is delivered, it can grow from the alloy under application of the heat, so that moving the heated zone will cause the semiconductor to deposit progressively along the void. The void can be filled using this technique; if the void width is small enough for quantum confinement, nanowires can be created. The alloy is preferably a eutectic alloy. For example, to deposit silicon in this way, a plug of gold can be implanted, and an alloy of AuSi formed, such as has been demonstrated in low pressure techniques implemented in nanoporous alumina membranes [11].

FIGS. 6A to 6E illustrate the deposition of polycrystalline Germanium semiconductor via the thermal decomposition of $GeH_4$ inside a 2 micron capillary in an annular fashion over several cm in length. Raman spectroscopy confirms the crystalline nature and elemental identity of this material.

FIGS. 7A to 7D illustrate thermal decomposition of Silane inside microstructured optical fibres and demonstrate the conformal deposition of silicon (with some evidence of faceting) inside large air fraction holey fibres with of the order of micron sized holes over several cm in length. Raman spectroscopy confirms the crystalline nature and elemental identity of this material. The annular thermal decomposition of Silane to silicon inside two micron capillary fibres may also be performed.

Figure 8A:
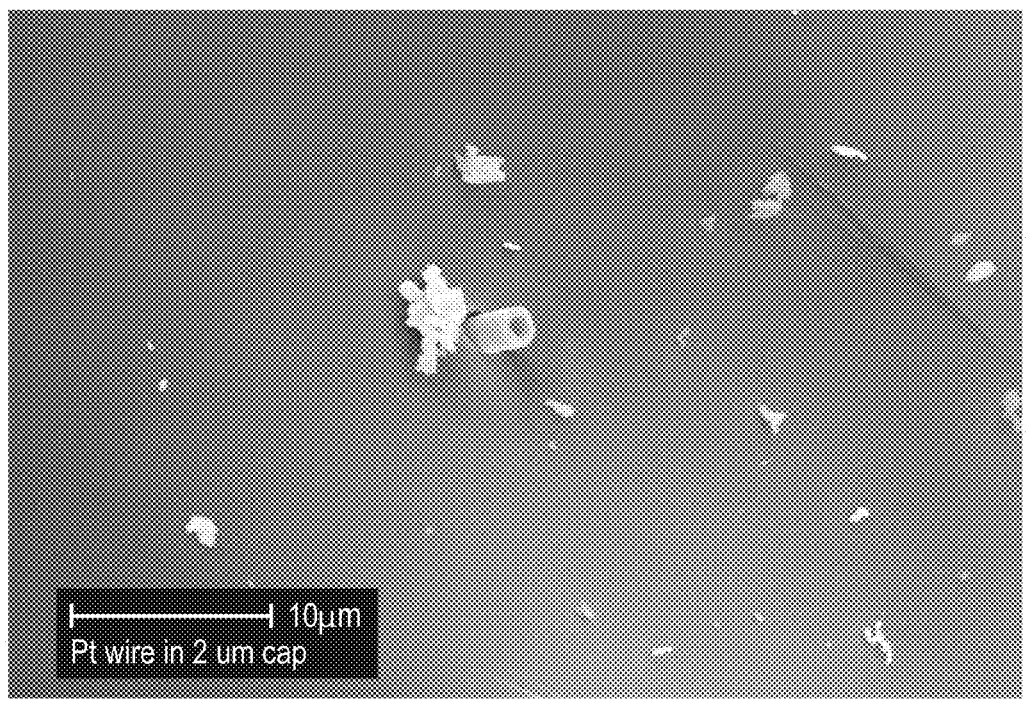
Figure 8B:
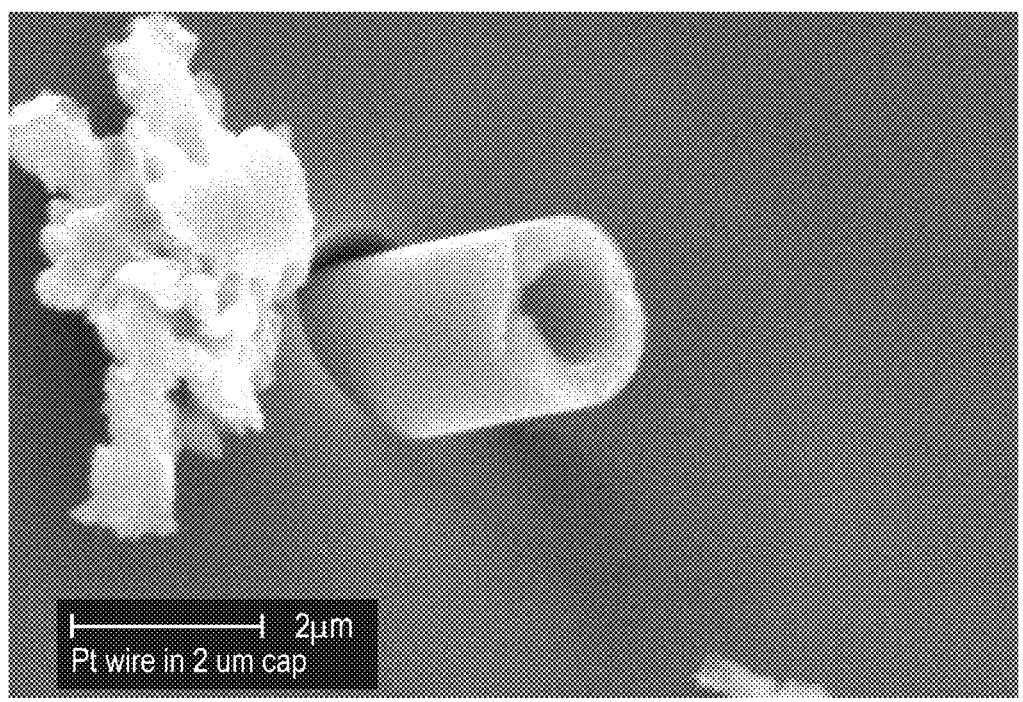

FIGS. 8A and 8B illustrate the annular deposition of Platinum metal from an organometallic precursor dissolved in $scCO_2$ inside a 2 micron silica capillary was demonstrated.

The deposition of Gold nanoparticles from an organometallic precursor dissolved in $scCO_2$ inside a 2 micron capillary fibre may also be performed.

Figure 9A:
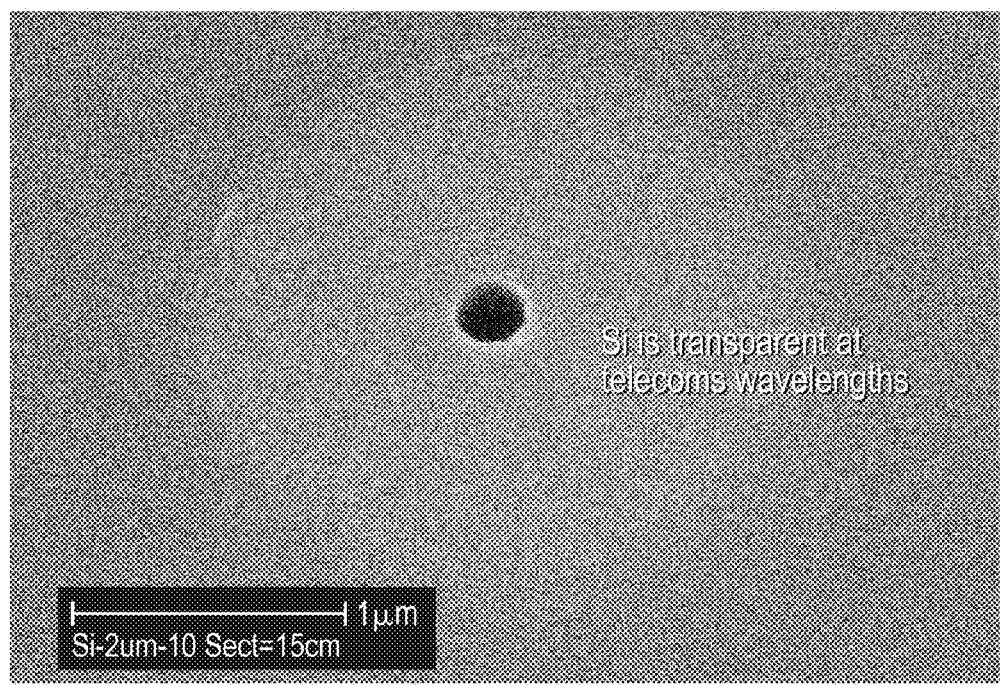
Figure 9B:
Figure 9C:
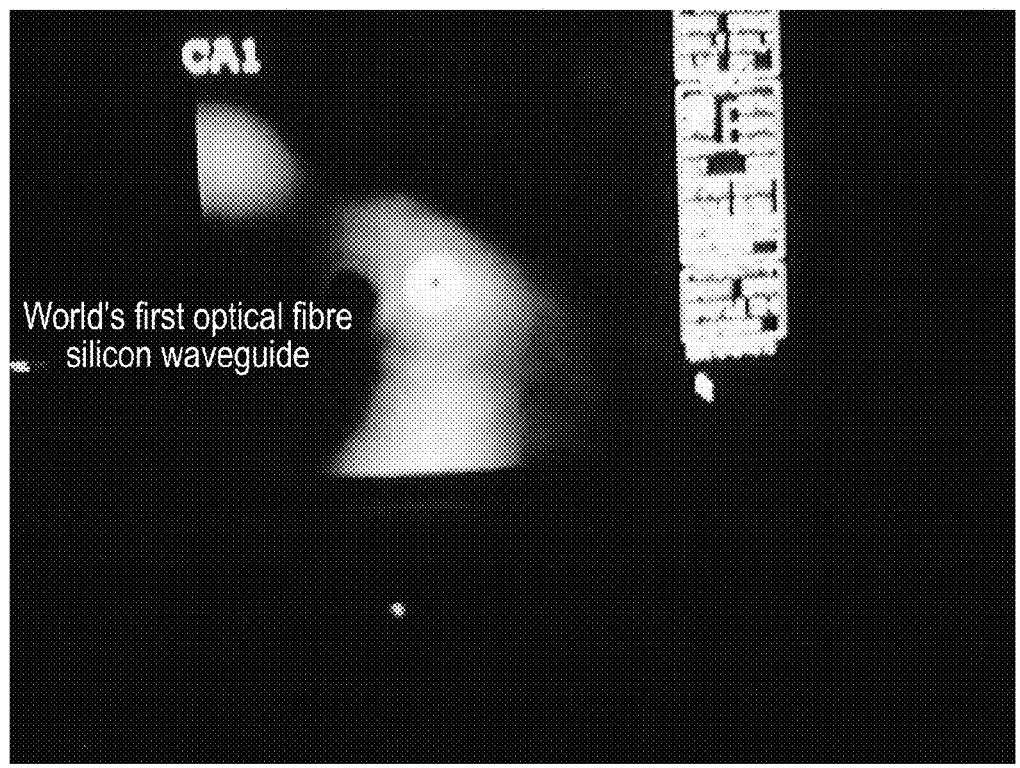

FIGS. 9A to 9C illustrate the results from butt coupling broadband ASE radiation (~1530-1570 nm, 177 mW optical power) from an EDFA into a silicon filled 2 micron capillary section approximately 7 cm long. A significant fraction of the ASE radiation is waveguided by the (multimode) silicon core, thus creating a silicon optical fibre waveguide.

Figure 10:
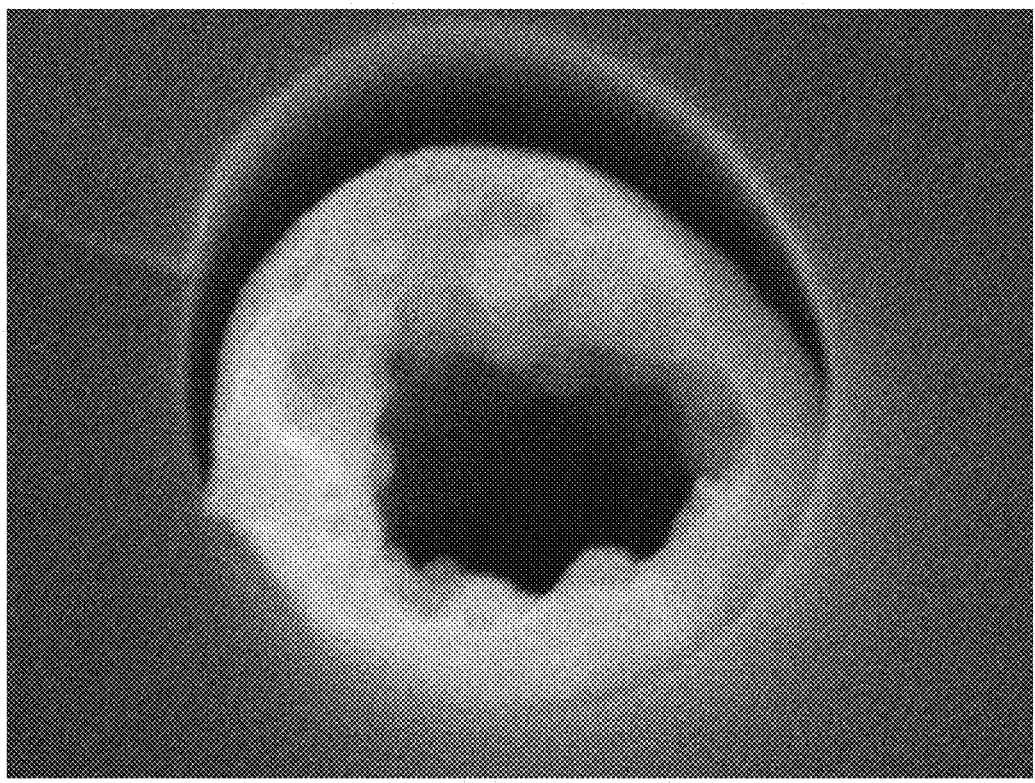

FIG. 10 illustrates the bulk deposition of gold metal in an annular fashion from an organometallic precursor dissolved in $scCO_2$ inside a 2 micron capillary fibre. This has applications in plasmonic devices such as surface enhanced Raman sensors and various sub-wavelength devices that allow the control of light via plasmonic manipulation. Fibre-based SERS sensors constructed from gold deposited within nanoscale capillary holes have the potential to detect small amounts of molecules, such as explosives and nerve agents, making them valuable for security applications. An additional advantage is that chemicals can be separated chromatographically within the fibre to allow complex mixtures to be analyzed. Other applications include electrodes within fibres for exploiting electrooptic effects of co-deposited semiconductor materials, and in the longer term for the formation of ohmic contacts to electrically pumped optoelectronics such as LEDs and lasers.

Figure 11:

FIG. 11 illustrates the results of a 514.5 nm laser focused to a spot size of approx 2 microns as a local heating source inside a 2 micron capillary fibre. The incident laser power of 2.5 mW deposited bulk gold metal over a localized regions approx 10-20 microns long and plugged completely after 50 minutes. This demonstrates the potential for complex longitudinal/axial and radial patterning of functional materials inside optical fibre devices. Phase masking, interfering beams and multiphoton absorption may allow for the deposit of holographically defined 3D structures allowing access a large experimental parameter space.

The thermal deposition (in a furnace) of nickel from decomposition of nickelocene in super-critical fluid may be performed. The nickel can be deposited as nanoparticles on the inside walls of a 2 micron capillary. The experiment may be run for over 24 hours in a small resistive heating furnace with the result of eventually plugging up completely, implying the deposition of bulk material. Nickel can be used for seeding the growth of carbon nanotubes inside optical fibres as well as a ferromagnetic material for the fabrication of magnetooptic fibre devices such as optical isolators based on Faraday rotator effect.

Figure 12:
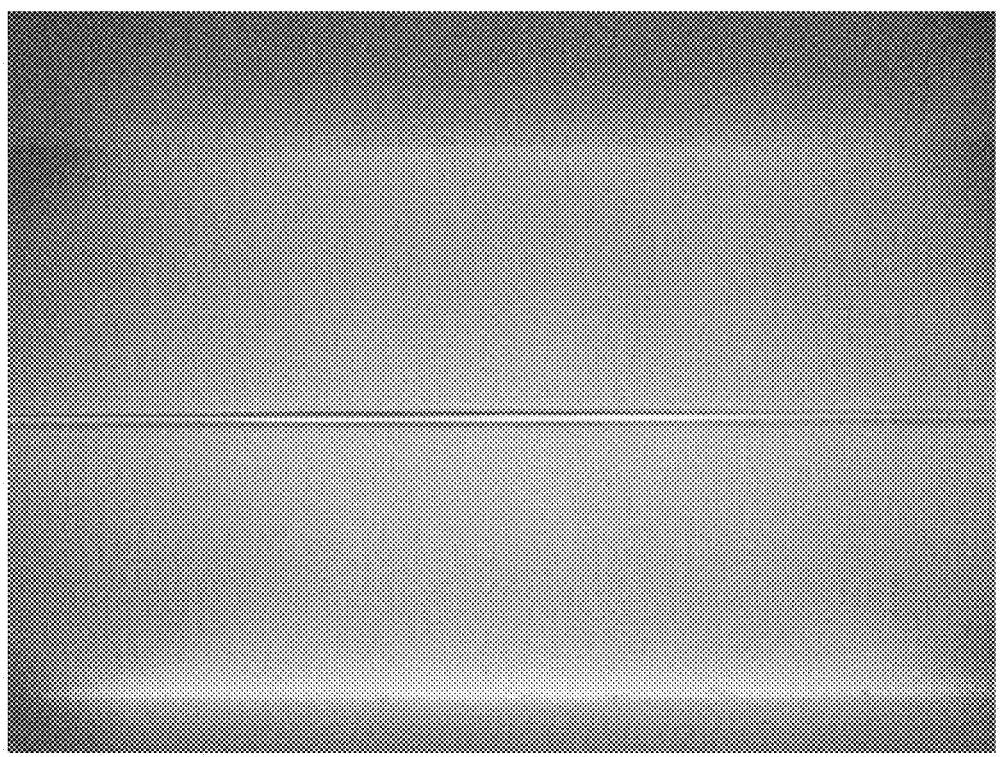

FIG. 12 illustrates the results of laser-assisted deposition of silicon inside 2 μm capillary over a localized region approximately 20-30 microns. Arsenic deposition from the thermal decomposition of Arsine inside a capillary may also be performed.

Figure 13:
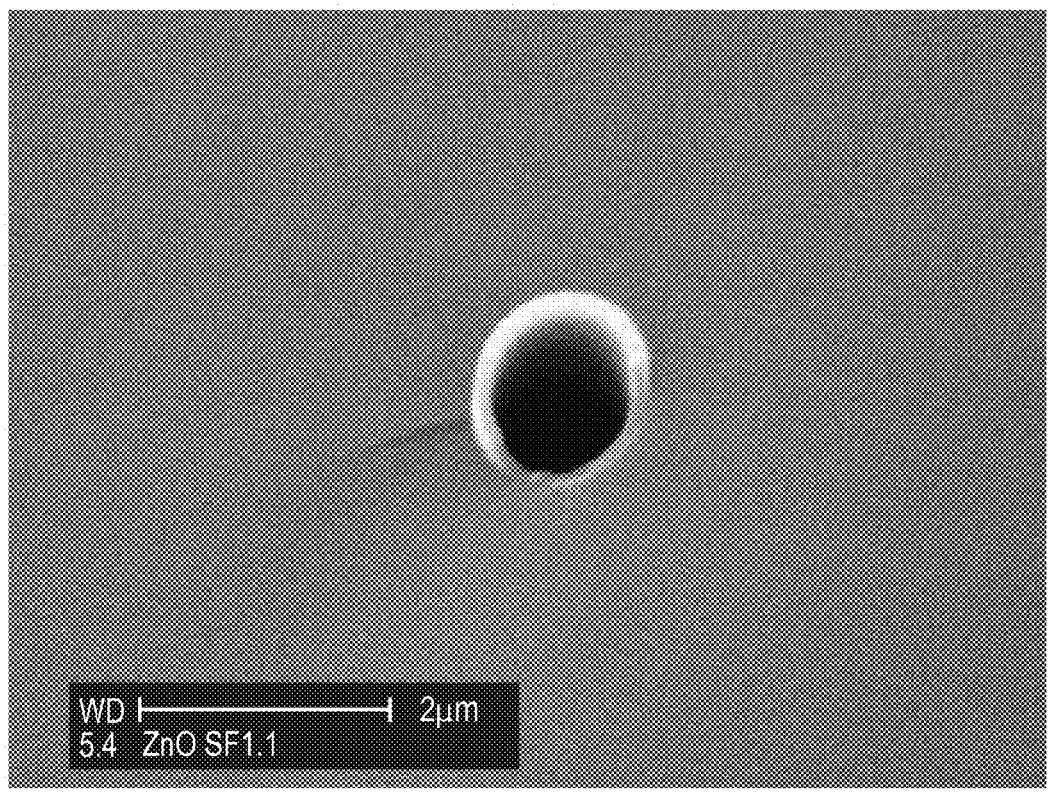

FIG. 13 illustrates the annular deposition of zinc metal from an organometallic precursor dissolved in $scCO_2$ inside a 2 micron silica capillary.

Figure 14:
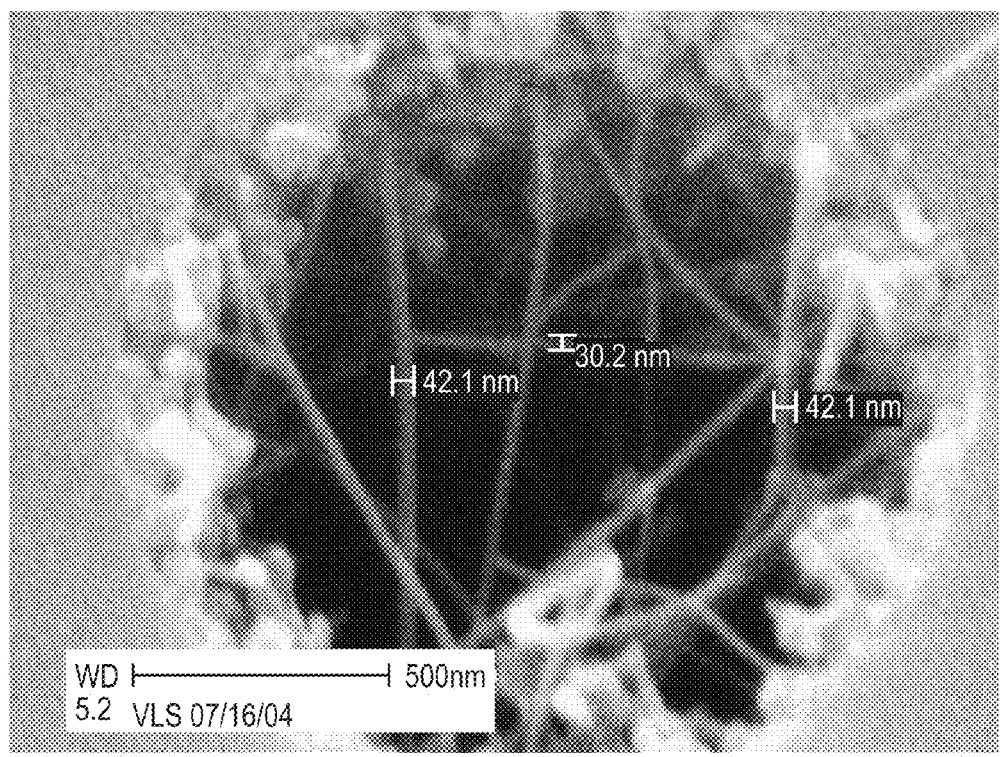

FIG. 14 illustrates the results when a fibre containing gold deposits in the centre was placed inside a furnace and attached to a reservoir containing a Silane-Helium gas mixture. The fibre was not completely plugged with gold. Only small particles of gold were inside the capillary. The gas flow rate noticeably decreased upon reaching ~360 C (eutectic temp. of Au—Si alloy). When silane is introduced into the capillary and heated, it is dissolved in the gold particles, resulting in a supersaturated alloy which then begins to grow into a single crystal silicon nanowire. The crystalline nature of the nanowires was confirmed by Raman spectroscopy. This demonstrates single crystal semiconductor growth inside an optical fibre.

Figure 15:
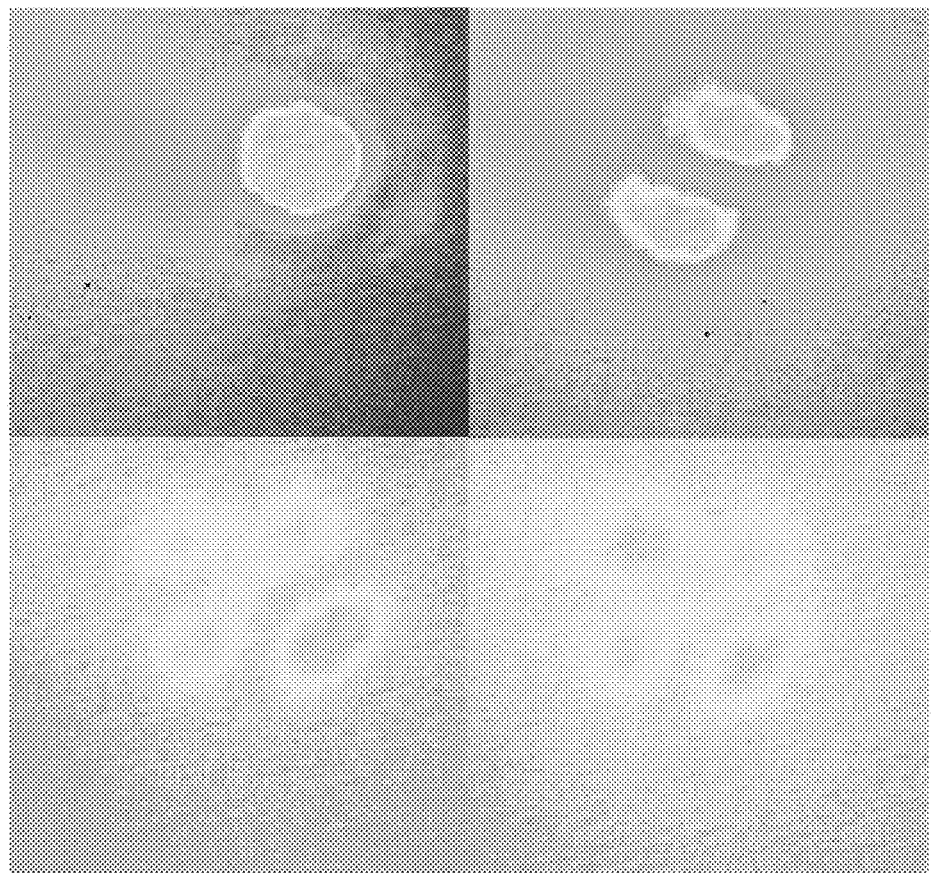

FIG. 15 illustrates the results when a 12 micron silica capillary approx 7 cm long was filled with polycrystalline Germanium semiconductor for mid-IR characterisation at Wright-Patterson Airforce Base. Here, a 1.064 μm CW Nd-YAG (Light Solutions Corp, CA) pumped periodically poled lithium niobate (PPLN) OPO was used for generating 3.258 μm wavelength idler beam with ~500 mW of power. A dielectric 1064 nm mirror was used at first for visible light alignment. This filter cuts out the 3.258 μm and 1064 nm beam, but allows the red light to pass through. After the initial alignment with red laser light the dielectric mirror was removed and replaced with a Ge-filter, which cuts out all wavelengths except the idler at 3.258 μm. Two ZnSe lenses with focal lengths of 19 mm were used to couple light into and out of the fiber. A pyroelectric camera (ElectroPhysics PV320) was used to image the output beams. The zeroth order mode as well as higher order modes can be seen in FIG. 15. Translating the fiber in the x-y plane perpendicular to the propagation direction activates the different modes, resulting in a Germanium mid-IR optical fibre waveguide. Some preliminary cut-back measurements suggest the limits for the propagation losses are between 0 and 93.3 μW for 31 mm propagation, or 0 to 0.332 μW/mm. This translates to a maximum upper limit of 0.7 dB/3.1 cm=0.23 dB/cm. The average loss is 19.8% of the loss (wrt power output from the 35 mm long fiber), or 0.432 dB/3.1 cm=0.14 dB/cm.

Figure 16:
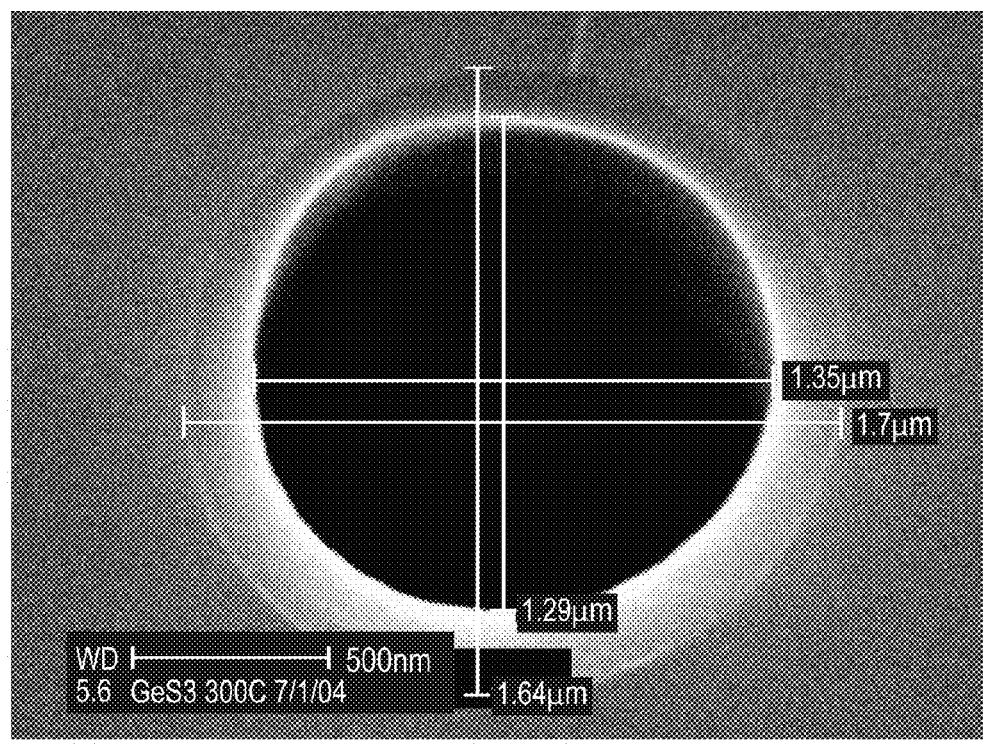

FIG. 16 illustrates Germanium sulphide semiconductor annularly deposited inside a 2 μm capillary fibre. The germanium sulphide is deposited by way of thermal decomposition of $GeH_4$ and $H_2S$. This shows the deposition of a bulk compound semiconductor within an optical fibre waveguide, thus leading the way towards the technologically important optoelectronic direct bandgap binary semiconductor systems such as GaAs, InAs etc.

Figure 17A:
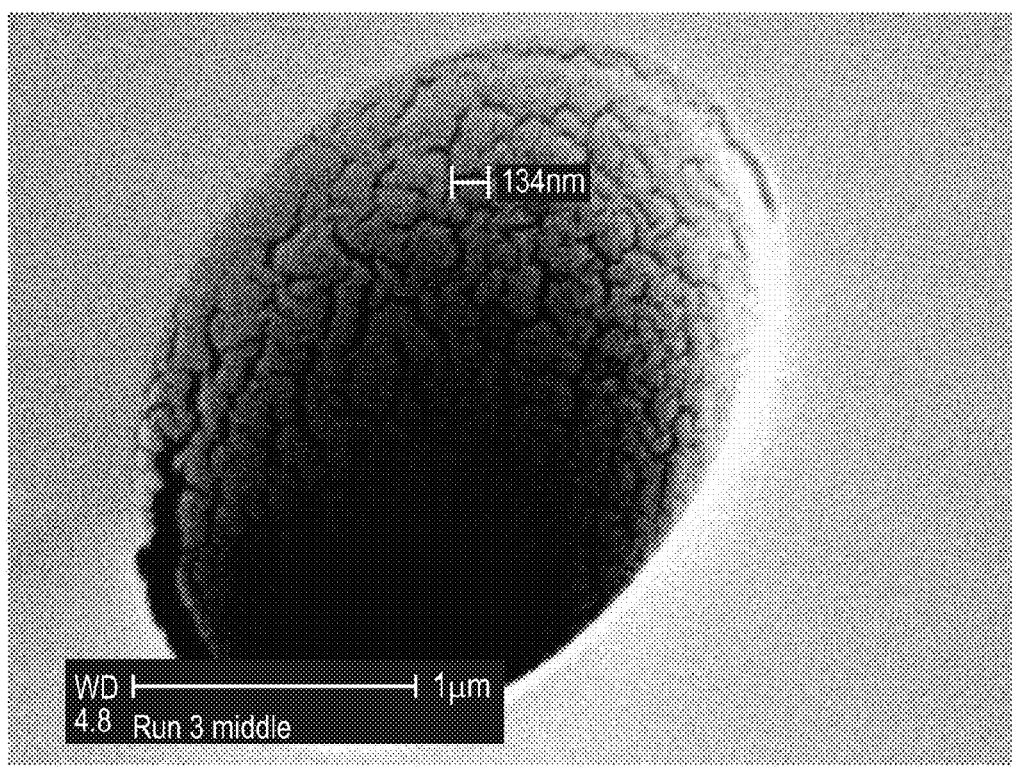
Figure 17B:
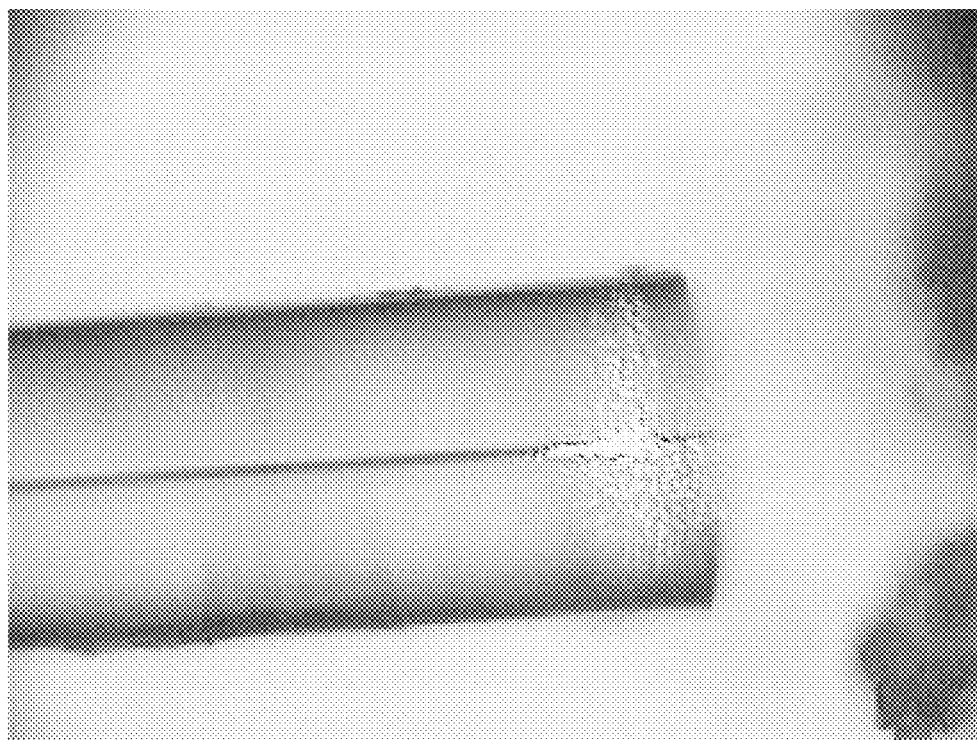
Figure 17C:
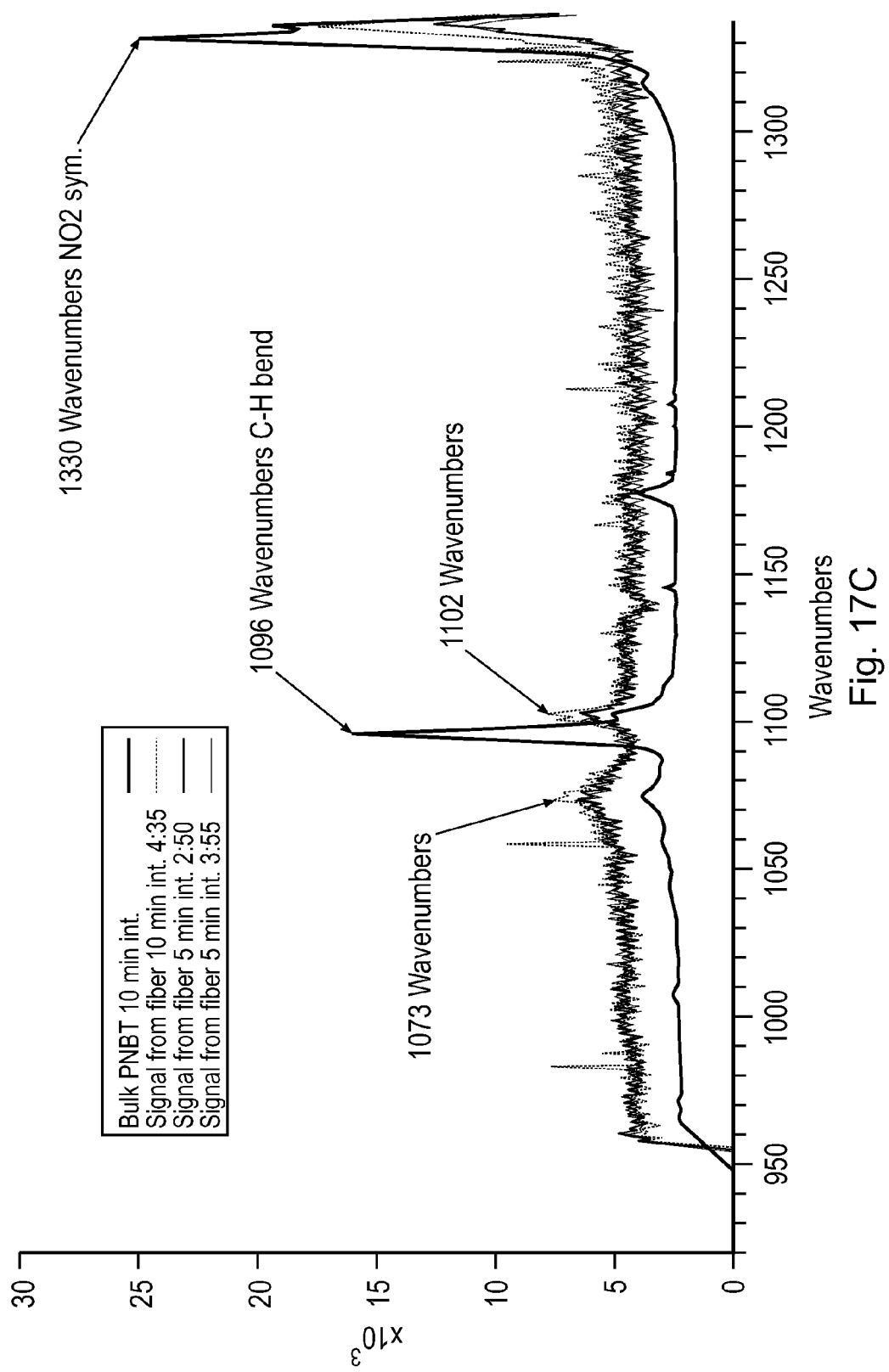

FIGS. 17A to 17C illustrate evidence of SERS inside a 2 μm capillary fibre. Raman spectra can be collected using 633 nm excitation (2 mW at sample) with a 40× objective and a five minute integration time. The figures show that the first non-noise spectrum was collected 2 hours and 35 minutes after the PNBT (paranitrobenzenethiol) is placed at the end of the capillary. Spectra are only taken every 30 min. to reduce heating of the fibre. The second image shows two peaks at 1073 and 1102 wavenumbers with roughly equal intensity when the spectrum is taken of the fibre. This is consistent with the observations of Skadtchenko and Aroca of SERS of PNBT on silver. The third image shows that the S-H signal is absent in the fibre sample, but observed in the bulk sample after PNBT is detected at 1330, 1073, and 1102 wavenumbers. This data indicates that the signal from the fibre is actually a SERS signal.

A range of different materials, and techniques for controlling the deposition of the semiconductor into the microstructured material, have been presented. It is to be understood that these various features can be combined as desired, so as to allow fabrication of different metamaterials, made of different combinations of materials and with different physical structures.

REFERENCES

[1] U.S. Pat. No. 5,838,868
[2] "Quasicontinuous gain in sol-gel derived CdS quantum dots", J Butty, Y Z Hu, N Peyghambarian, Y H Kao and JD Mackenzie, Appl. Phys. Lett. 67 p 2672 1995
[3] Wundke et al, Appl. Phys. Lett. 75 p 3060 1999
[4] Pavesi et al, Nature, 408 p 440 2000
[5] DE 19 701 723 A1
[6] Miyagi et al, Appl. Phys. Lett. 43 p 430 1983
[7] Harrington et al, Fiber and Integrated Optics 19 p 211 2000
[8] "Control of thickness and orientation of solution-grown silicon nanowires", J D Holmes, K P Johnson, R C Doty and B A Korgel, Science 287 p 1471 2000
[9] "The formation of dimensionally ordered silicon nanowires within mesoporous silica", N R B Coleman, M A Morris, T R Spalding and J D Holmes, J. Am. Chem. Soc. 123 p 187 2001
[10] WO 01/32952 A2
[11] Lew et al, J. Vac. Sci. Tech. B 20 p 389 2002

The invention claimed is:

1. A method of fabricating a metamaterial comprising:
providing a sample of elongate engineered microstructured material comprising one or more elongate voids running substantially the length of the sample, the sample configured to transmit electromagnetic radiation;
providing a high pressure fluid comprising at least one semiconductor carried in at least one carrier fluid;
passing the high pressure fluid through the one or more voids; and
causing the semiconductor to deposit onto one or more surfaces of the one or more voids to form the metamaterial.

2. A method according to claim 1, in which the carrier fluid is in its supercritical phase.

3. A method according to claim 1, in which the high pressure fluid has a pressure of 1 MPa or above, or of 2.5 MPa or above, or of 5 MPa or above, or of 10 MPa or above, or of 25 MPa or above, or of 50 MPa or above, or of 100 MPa or above, or of 500 MPa or above, or of 1000 MPa or above, or of 2000 MPa or above.

4. A method according to claim 1, in which the one or more voids have a length and a width such that the ratio of the length to the width is in the range 100:1 to 1000:1, or 100:1 to 10000:1, or 100:1 to 100000:1, or 100:1 to $10^6$:1, or 100:1 to $10^7$:1, or 100:1 to $10^8$:1, or 100:1 to $10^9$:1, or 100:1 to $10^{10}$:1, or 100:1 to $10^{11}$:1, or 100:1 to $10^{12}$:1, or 1000:1 to 10000:1, or 1000:1 to 100000:1, or 1000:1 to $10^6$:1, or 1000:1 to $10^7$:1, or 1000:1 to $10^8$:1, or 1000:1 to $10^9$:1, or 1000:1 to $10^{10}$:1, or 1000:1 to $10^{11}$:1, or 1000:1 to $10^{12}$:1 or 10000:1 to 100000:1, or 10000:1 to $10^6$:1, or 10000:1 to $10^7$:1, or 10000:1 to $10^8$:1, or 10000:1 to $10^9$:1, or 10000:1 to $10^{10}$:1, or 10000:1 to $10^{11}$:1, or 10000:1 to $10^{12}$:1, or 100000:1 to $10^6$:1, or 100000:1 to $10^7$:1, or 100000:1 to $10^8$:1, or 100000:1 to $10^9$:1, or 100000:1 to $10^{10}$:1, or 100000:1 to $10^{11}$:1, or 100000:1 to $10^{12}$:1.

5. A method according to claim 1, in which the one or more voids have a width in the range 1 nm to 100 nm.

6. A method according to claim 1, in which the sample of microstructured material comprises a holey optical fibre.

7. A method according to claim 1, in which the sample of microstructured material is planar.

8. A method according to claim 1, in which the one or more voids have a smallest dimension between 1 nm and 1 μm.

9. A method according to claim 8, in which the engineered microstructured material, the at least one semiconductor and dimensions of the one or more voids are selected to give a metamaterial that is a mesomaterial.

10. A method according to claim 1 any one of claim 1, in which the one or more voids have a smallest dimension between 1 μm and 1 mm.

11. A method according to claim 1, in which the sample of microstructured material is fabricated from one or more of: glass materials, plastics materials, ceramic materials, semiconductor materials and metallic materials.

12. A method according to claim 1, in which the semiconductor is deposited to form one or more nanoparticles.

13. A method according to claim 1, in which the semiconductor is deposited to form an annular layer.

14. A method according to claim 13, further comprising controlling the amount of semiconductor that is deposited to form an annular layer of a selected thickness.

15. A method according to claim 13, in which the annular layer comprises a thin film.

16. A method according to claim 15, in which the thickness of the annular layer is selected to reduce the width of the one or more voids to a selected size.

17. A method according to claim 15, and further comprising providing a further high pressure fluid comprising a further semiconductor and passing the further high pressure fluid through the one or more voids to cause the further semiconductor to deposit on the semiconductor previously deposited, in which the selected size of the one or more voids is such as to cause quantum confinement in the deposited further semiconductor.

18. A method according to claim 1, and further comprising providing a further high pressure fluid comprising a further semiconductor and passing the further high pressure fluid through the one or more voids to cause the further semiconductor to deposit on the semiconductor previously deposited.

19. A method according to claims 1, in which the semiconductor is deposited on a surface of the one or more voids until the one or more voids is substantially filled with the semiconductor.

20. A method according to claim 1, in which the semiconductor is deposited to create one or more quantum structures.

21. A method according to claim 1, in which causing the semiconductor to deposit comprises heating the high pressure fluid as it passes through the one or more voids to cause the semiconductor to separate from the carrier fluid and deposit.

22. A method according to claim 21, comprising heating the high pressure fluid by heating selected portions of the sample for selected durations to control an amount of semiconductor that becomes deposited.

23. A method according to claim 21, in which heating the high pressure fluid comprises applying a temperature gradient along all or part of the sample.

24. A method according to claim 23, in which the temperature gradient is dynamically varying.

25. A method according to claim 23, in which the temperature gradient is static.

26. A method according to claim 21, in which heating the high pressure fluid comprises heating a portion of the sample to create a heated zone, and moving the heated zone along the sample to deposit the semiconductor sequentially along all or part of the sample.

27. A method according to claim 26, and further comprising implanting a plug of alloy-forming material in the one or more voids before passing the high pressure fluid through the one or more voids, passing the high pressure fluid through the one or more voids and allowing an alloy to form from the semiconductor and the alloy-forming material in the heated zone, the alloy depositing the semiconductor in response to the heat.

28. A method according to claim 1, in which causing the semiconductor to deposit comprises altering the pressure of the high pressure fluid as it passes through the one or more voids to cause the semiconductor to separate from the carrier fluid and deposit.

29. A method according to claim 1, in which causing the semiconductor to deposit comprises applying a pressure gradient along all or part of the sample as the high pressure fluid is passed through the one or more voids.

30. A method according to claim 1, in which causing the semiconductor to deposit comprises applying a gradient in concentration of the semiconductor in the high pressure fluid along all or part of the sample as the high pressure fluid is passed through the one or more voids.

31. A method according to claim 1, in which causing the semiconductor to deposit comprises providing a carrier fluid that can diffuse through the engineered microstructured material, and allowing the carrier fluid to diffuse through walls of the one or more voids to leave the semiconductor within the one or more voids.

32. A method according to claim 31, in which the carrier fluid can further diffuse through the deposited semiconductor.

33. A method according to claim 1, in which the semiconductor has a precursor form in the high pressure fluid, and causing the semiconductor to deposit comprises decomposing the precursor into the semiconductor and a by-product that can diffuse through the engineered microstructured material and allowing the by-product to diffuse through walls of the one or more voids.

34. A method according to claim 33, in which the precursor is a hydride of the semiconductor and the by-product is hydrogen.

35. A method according to claim 1, in which causing the semiconductor to deposit comprises providing a semiconductor that will grow from a seed, and incorporating a seed into the one or more voids so that the semiconductor will grow within the one or more voids as the high pressure fluid passes through the one or more voids.

36. A method according to claim 1, in which causing the semiconductor to deposit comprises applying one or more deposition-causing conditions to the sample that vary along a gradient over all or part of the sample.

37. A method according to claim 1, in which the carrier fluid is argon.

38. A method according to claim 1, in which the carrier fluid is helium.

39. A method according to claim 1, in which the carrier fluid is hydrogen.

* * * * *